(12) United States Patent
Kim et al.

(10) Patent No.: US 12,414,442 B2
(45) Date of Patent: Sep. 9, 2025

(54) DISPLAY DEVICE

(71) Applicant: Samsung Display Co., LTD., Yongin-si (KR)

(72) Inventors: Taegyun Kim, Yongin-si (KR); Minjae Jeong, Yongin-si (KR); Jaehyung Cho, Yongin-si (KR); Bon-Yong Koo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/406,131

(22) Filed: Jan. 6, 2024

(65) Prior Publication Data

US 2024/0381694 A1 Nov. 14, 2024

(30) Foreign Application Priority Data

May 8, 2023 (KR) .................. 10-2023-0058981

(51) Int. Cl.
| | |
|---|---|
| *H10K 59/121* | (2023.01) |
| *G09G 3/3233* | (2016.01) |
| *H10K 59/131* | (2023.01) |

(52) U.S. Cl.
CPC ....... *H10K 59/1216* (2023.02); *G09G 3/3233* (2013.01); *H10K 59/131* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2320/02* (2013.01)

(58) Field of Classification Search
CPC ............. H10K 59/1216; H10K 59/131; G09G 3/3233; G09G 2300/0842; G09G 2300/0819; G09G 2300/0861; G09G 2310/08; G09G 2320/02
See application file for complete search history.

(56) References Cited

U.S. PATENT DOCUMENTS

| | | |
|---|---|---|
| 6,897,480 B2 | 5/2005 | Park |
| 7,414,599 B2 | 8/2008 | Chung et al. |

(Continued)

FOREIGN PATENT DOCUMENTS

| | | |
|---|---|---|
| KR | 100506780 B1 | 8/2005 |
| KR | 1020080062307 A | 7/2008 |
| KR | 1020220138917 A | 10/2022 |

*Primary Examiner* — Sujit Shah
(74) *Attorney, Agent, or Firm* — CANTOR COLBURN LLP

(57) ABSTRACT

A display device includes: first to third pixel circuits, each of which includes a first transistor including a first electrode connected to a first power line, a second electrode connected to the light emitting element, and a control electrode connected to a node, a second transistor including a first electrode connected to a data line, a second electrode connected to the first transistor's first electrode, and a control electrode connected to a write scan line, and a capacitor including a first electrode connected to a constant voltage line and a second electrode connected to the node. The constant voltage line is disposed between the second and third pixel circuits. An extension electrode of the display device is connected to the first electrode of the capacitor of each of the second and third pixel circuits, extends between the second and third pixel circuits, and is connected to the constant voltage line.

17 Claims, 22 Drawing Sheets

(56) References Cited

U.S. PATENT DOCUMENTS

| | | | |
|---|---|---|---|
| 2011/0148847 A1* | 6/2011 | Ikeda | G09G 3/3233 |
| | | | 345/212 |
| 2017/0040407 A1 | 2/2017 | Shin et al. | |
| 2021/0264857 A1* | 8/2021 | Wang | G09G 3/3258 |
| 2021/0407354 A1* | 12/2021 | Zhang | G02F 1/134363 |
| 2022/0157908 A1 | 5/2022 | Park et al. | |
| 2022/0320253 A1 | 10/2022 | Cho et al. | |
| 2022/0328600 A1* | 10/2022 | Dong | H10K 59/1216 |
| 2022/0358880 A1* | 11/2022 | Yonebayashi | G09G 3/3233 |
| 2022/0376024 A1* | 11/2022 | Zheng | H10K 59/1216 |
| 2022/0406257 A1* | 12/2022 | Gu | G09G 3/3241 |

* cited by examiner

DISPLAY DEVICE

This application claims priority to Korean Patent Application No. 10-2023-0058981 filed on May 8, 2023, and all the benefits accruing therefrom under 35 U.S.C. § 119, the content of which in its entirety is herein incorporated by reference.

BACKGROUND

Embodiments of the present disclosure described herein relate to a display device.

In general, an electronic device, such as a smart phone, a digital camera, a notebook computer, a car navigation unit, a smart television, or the like, which provides an image to a user includes a display device for displaying an image. The display device generates an image and provides the generated image to the user through a display screen.

The display device includes a plurality of pixels for generating an image and a driver for driving the pixels. Each of the pixels includes a light emitting element, a plurality of transistors connected to the light emitting element, and at least one capacitor connected to the transistors.

The pixels are connected to data lines, scan lines, first power lines, and second power lines. In response to scan signals provided through the scan lines, the pixels receive data voltages through the data lines. The pixels receive a first voltage and a second voltage through the first power lines and the second power lines. The pixels are driven by the data voltages, the first voltage, and the second voltage and display an image.

When the data voltages are rapidly varied, the data voltages may affect the first power lines adjacent to the data lines, and the level of the first voltage may be varied. When the level of the first voltage is varied, the pixels may not display a normal image.

SUMMARY

Embodiments of the present disclosure provide a display device capable of being driven without being affected by variation of the level of a first voltage received through a first power line.

According to an embodiment, a display device includes: a first pixel circuit, a second pixel circuit, a third pixel circuit, a light emitting element connected to each of the first, second, and third pixel circuits, and an extension electrode. Each of the first, second, and third pixel circuits includes a first transistor including a first electrode connected to a first power line, a second electrode connected to an anode of the light emitting element, and a control electrode connected to a node, a second transistor including a first electrode connected to a data line, a second electrode connected to the first electrode of the first transistor, and a control electrode connected to a write scan line, and a capacitor including a first electrode connected to a constant voltage line and a second electrode connected to the node. The constant voltage line is disposed between the second pixel circuit and the third pixel circuit, and the extension electrode is connected to the first electrode of the capacitor of each of the second and third pixel circuits, extends between the second pixel circuit and the third pixel circuit, and is connected to the constant voltage line.

According to an embodiment, a display device includes: a first pixel circuit, a second pixel circuit, a third pixel circuit, a light emitting element connected to each of the first, second, and third pixel circuits. Each of the first, second, and third pixel circuits includes a first transistor including a first electrode connected to a first power line, a second electrode connected to an anode of the light emitting element, and a control electrode connected to a node, a second transistor including a first electrode connected to a data line, a second electrode connected to the first electrode of the first transistor, and a control electrode connected to a write scan line, and a capacitor including a first electrode connected to a constant voltage line and a second electrode connected to the node. The first electrodes of the capacitors of the first, second, and third pixel circuits are monolithic and connected to the constant voltage line.

According to an embodiment, a display device includes a first pixel circuit, a second pixel circuit, a third pixel circuit, a light emitting element connected to each of the first, second, and third pixel circuits, and an extension electrode. Each of the first, second, and third pixel circuits includes a first transistor including a first electrode connected to a first power line, a second electrode connected to an anode of the light emitting element, and a control electrode connected to a node, a second transistor including a first electrode connected to a data line, a second electrode connected to the first electrode of the first transistor, and a control electrode connected to a write scan line, and a capacitor including a first electrode connected to a second power line and a second electrode connected to the node. The second power line is disposed between the second pixel circuit and the third pixel circuit and is not disposed between the first pixel circuit and the second pixel circuit. The extension electrode is connected to the first electrode of the capacitor of each of the second and third pixel circuits, extends between the second pixel circuit and the third pixel circuit, and is connected to the second power line.

BRIEF DESCRIPTION OF THE FIGURES

The above and other objects and features of the present disclosure will become apparent by describing in detail embodiments thereof with reference to the accompanying drawings.

DETAILED DESCRIPTION

Figure 1:
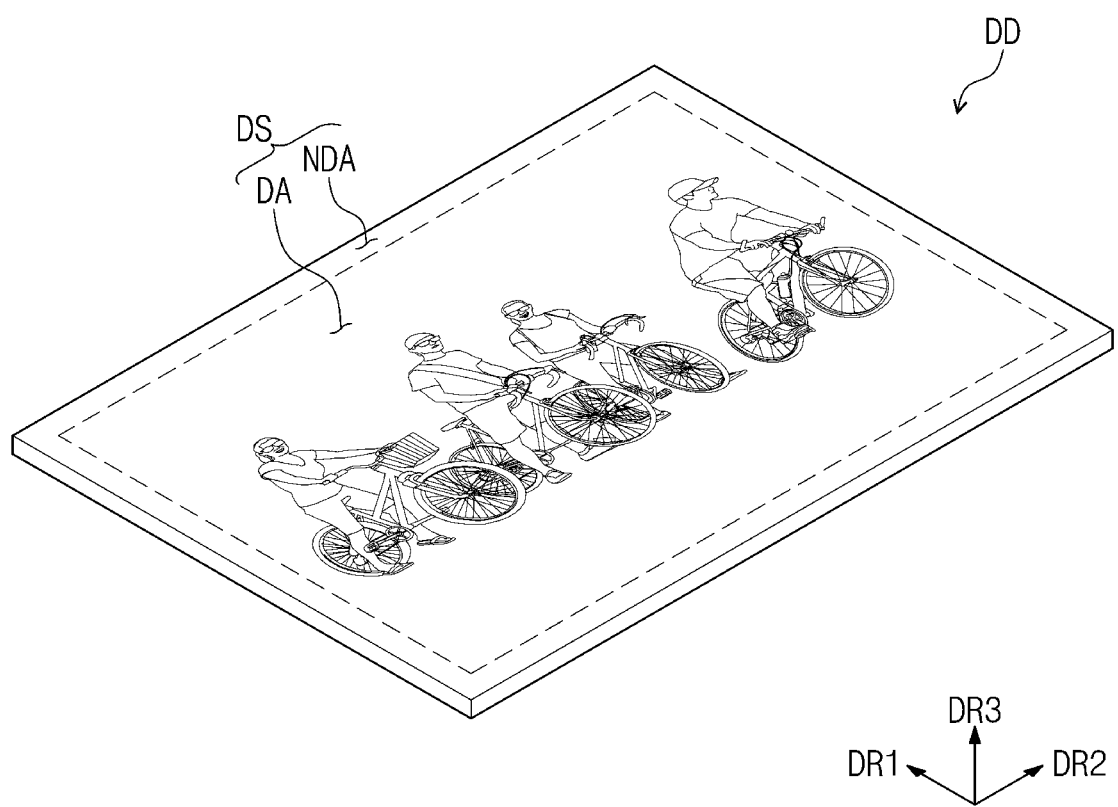
FIG. 1 is a perspective view of a display device according to an embodiment of the present disclosure.

In this specification, when it is mentioned that a component (or, an area, a layer, a part, etc.) is referred to as being "on", "connected to" or "coupled to" another component, this means that the component may be directly on, connected to, or coupled to the other component or a third component may be present therebetween.

Identical reference numerals refer to identical components. Additionally, in the drawings, the thicknesses, proportions, and dimensions of components are exaggerated for effective description.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes all of one or more combinations defined by related components.

Terms such as "first", "second", and the like may be used to describe various components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In addition, terms such as "below", "under", "above", and "over" are used to describe a relationship of components illustrated in the drawings. The terms are relative concepts and are described based on directions illustrated in the drawing.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Hereinafter, embodiments of the present disclosure will be described with reference to the accompanying drawings.

FIG. 1 is a perspective view of a display device according to an embodiment of the present disclosure.

Referring to FIG. 1, the display device DD may have a plane defined by a first direction DR1 and a second direction DR2. The display device DD may have a rectangular shape with short sides extending in the first direction DR1 and long sides extending in the second direction DR2. However, without being limited thereto, the display device DD may have various shapes such as a circular shape, a polygonal shape, and the like.

An upper surface of the display device DD may be defined as a display surface DS and may have a plane defined by the first direction DR1 and the second direction DR2. An image generated by the display device DD may be provided to a user through the display surface DS.

The display surface DS may include a display region DA and a non-display region NDA around the display region DA. The display region DA may display an image, and the non-display region NDA may not display an image. The non-display region NDA may surround the display region DA and may define the border of the display device DD that is printed in a predetermined color.

The display device DD may be used in large electronic devices such as a television, a monitor, and a billboard. In addition, the display device DD may be used in small and medium-sized electronic devices such as a personal computer, a notebook computer, a personal digital terminal, a car navigation unit, a game machine, a smart phone, a tablet computer, and a camera. However, these electronic devices are merely illustrative, and the display device DD may be used in other electronic devices without departing from the spirit and scope of the present disclosure.

Figure 2:
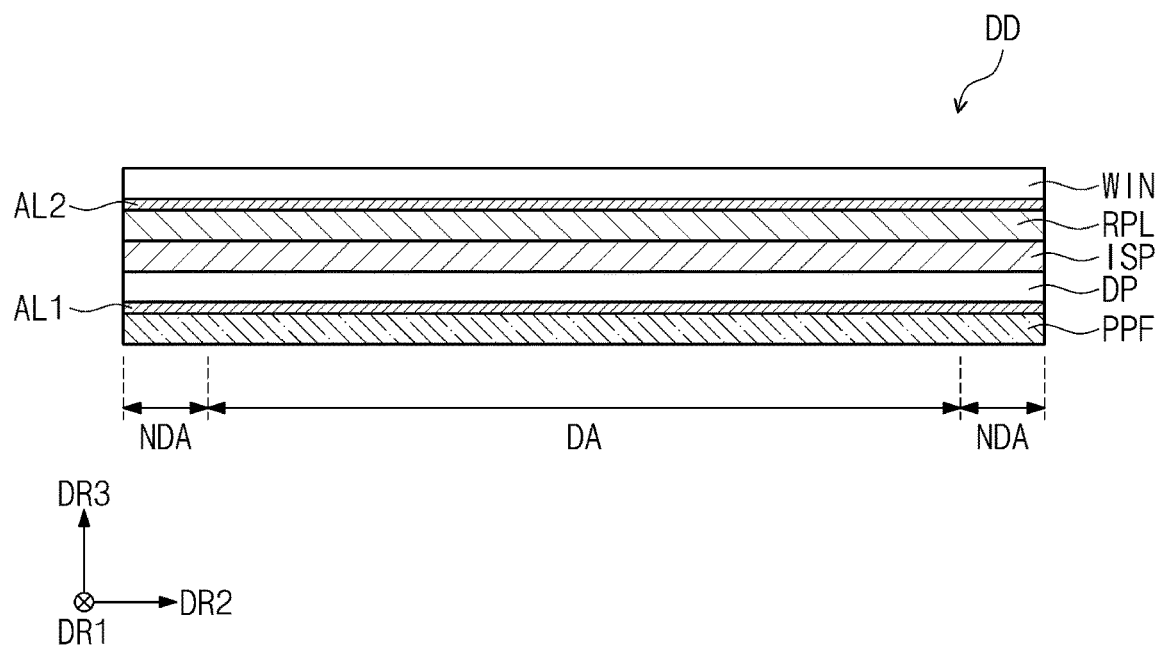
FIG. 2 is a sectional view of the display device illustrated in FIG. 1.

FIG. 2 is a sectional view of the display device illustrated in FIG. 1.

In FIG. 2, a section of the display device DD viewed in the first direction DR1 is illustrated.

Referring to FIG. 2, the display device DD may include a display panel DP, an input sensing unit ISP, an anti-reflection layer RPL, a window WIN, a panel protection film PPF, and first and second adhesive layers AL1 and AL2.

The display panel DP may be a flexible display panel. The display panel DP according to an embodiment of the present disclosure may be an emissive display panel. In an embodiment, for example, the display panel DP may be an organic light emitting display panel or an inorganic light emitting display panel. An emissive layer of the organic light emitting display panel may include an organic light emitting material. An emissive layer of the inorganic light emitting display panel may include quantum dots, quantum rods, and the like. Hereinafter, it will be exemplified that the display panel DP is an organic light emitting display panel.

The input sensing unit ISP may be disposed on the display panel DP. The input sensing unit ISP may include a plurality of sensing units (not illustrated) for sensing an external input in a capacitive type. The input sensing unit ISP may be directly manufactured on the display panel DP when the display device DD is manufactured. However, without being limited thereto, the input sensing unit ISP may be manufactured as a panel separate from the display panel DP and may be attached to the display panel DP by an adhesive layer.

The anti-reflection layer RPL may be disposed on the input sensing unit ISP. The anti-reflection layer RPL may be directly manufactured on the input sensing unit ISP when the display device DD is manufactured. However, without being limited thereto, the anti-reflection layer RPL may be manufactured as a separate panel and may be attached to the input sensing unit ISP by an adhesive layer.

The anti-reflection layer RPL may be defined as a film for preventing reflection of external light. The anti-reflection layer RPL may decrease the reflectance of external light incident toward the display panel DP from above the display device DD. Due to the anti-reflection layer RPL, the external light may not be visible to the user.

When external light travelling toward the display panel DP is reflected from the display panel DP and provided back to the user, the user may visually recognize the external light as in a mirror. To prevent such a phenomenon, the anti-reflection layer RPL may include a plurality of color filters that display the same colors as those of pixels of the display panel DP.

The color filters may filter external light into the same colors as those of the pixels. In this case, the external light may not be visible to the user. However, without being limited thereto, the anti-reflection layer RPL may include a phase retarder and/or a polarizer to decrease the reflectance of the external light.

The window WIN may be disposed on the anti-reflection layer RPL. The window WIN may protect the display panel DP, the input sensing unit ISP, and the anti-reflection layer RPL from external scratches and impacts.

The panel protection film PPF may be disposed under the display panel DP. The panel protection film PPF may protect a lower portion of the display panel DP. The panel protection film PPF may include a flexible plastic material such as polyethylene terephthalate ("PET").

The first adhesive layer AL1 may be disposed between the display panel DP and the panel protection film PPF, and the display panel DP and the panel protection film PPF may be bonded to each other by the first adhesive layer AL1. The second adhesive layer AL2 may be disposed between the window WIN and the anti-reflection layer RPL, and the window WIN and the anti-reflection layer RPL may be bonded to each other by the second adhesive layer AL2.

Figure 3:
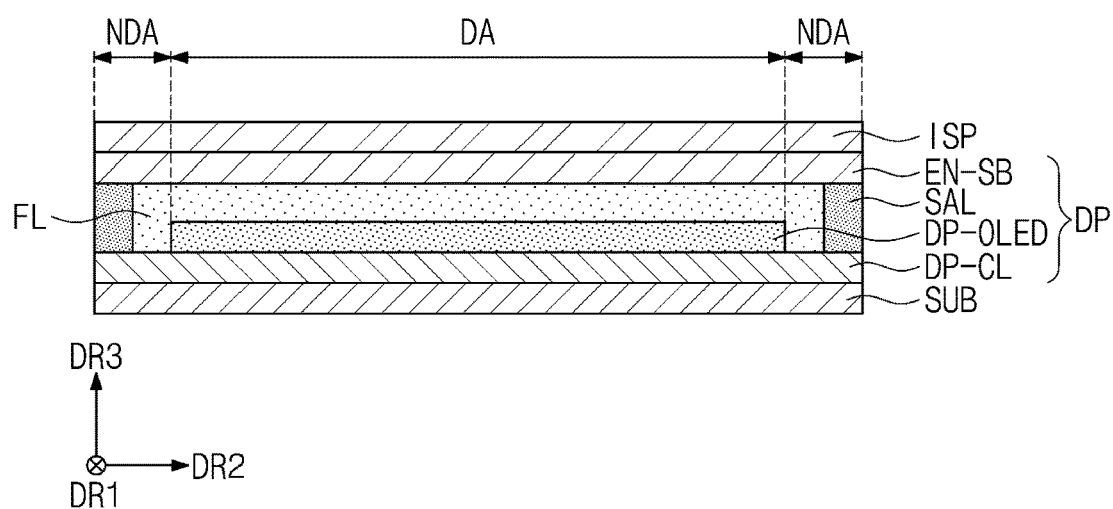
FIG. 3 is a sectional view of a display panel illustrated in FIG. 2.

FIG. 3 is a sectional view of the display panel illustrated in FIG. 2.

In FIG. 3, a section of the display panel DP viewed in the first direction DR1 is illustrated, and the input sensing unit ISP is illustrated together with the display panel DP.

Referring to FIG. 3, the display panel DP may include a substrate SUB, a circuit element layer DP-CL, a display element layer DP-OLED, an encapsulation substrate EN-SB, a sealing layer SAL, and a filler FL. The circuit element layer DP-CL may be disposed on the substrate SUB. The display element layer DP-OLED may be disposed on the circuit element layer DP-CL.

A plurality of pixels may be disposed in the circuit element layer DP-CL and the display element layer DP-OLED. Each of the pixels may include transistors disposed in the circuit element layer DP-CL and a light emitting element disposed in the display element layer DP-OLED and connected to the transistors.

The substrate SUB may include a display region DA and a non-display region NDA around the display region DA. The display element layer DP-OLED may be disposed on the display region DA. The encapsulation substrate EN-SB may be disposed on the display element layer DP-OLED. The substrate SUB and the encapsulation substrate EN-SB may be of a rigid type. Depending on this structure, the display panel DP may be of a rigid type.

The sealing layer SAL may be disposed between the substrate SUB and the encapsulation substrate EN-SB. The sealing layer SAL may be disposed on the non-display region NDA. The sealing layer SAL may bond the substrate SUB and the encapsulation substrate EN-SB to each other. The display element layer DP-OLED may be sealed between the substrate SUB and the encapsulation substrate EN-SB by the sealing layer SAL. The sealing layer SAL may include a photo-curable material.

The filler FL may be disposed between the substrate SUB and the encapsulation substrate EN-SB. The filler FL may be disposed in a space between the substrate SUB and the encapsulation substrate EN-SB that is sealed by the sealing layer SAL. The filler FL may include a thermosetting material.

The input sensing unit ISP may be directly disposed on the display panel DP. In an embodiment, for example, the input sensing unit ISP may be directly disposed on the encapsulation substrate EN-SB.

Figure 4:
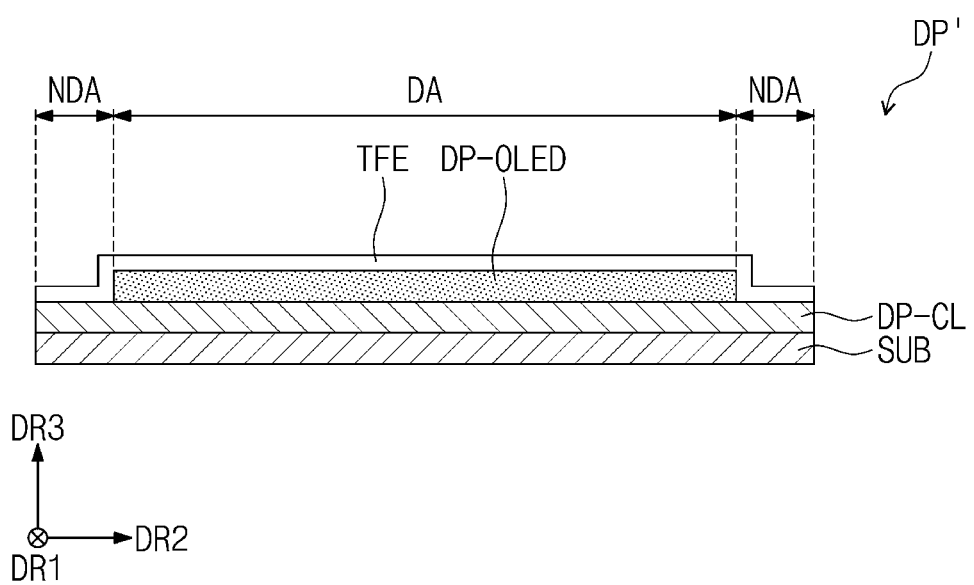
FIG. 4 is a sectional view of a display panel according to an embodiment of the present disclosure.

FIG. 4 is a sectional view of a display panel according to an embodiment of the present disclosure.

Referring to FIG. 4, the display panel DP' may include a circuit element layer DP-CL disposed on a substrate SUB, a display element layer DP-OLED disposed on the circuit element layer DP-CL, and a thin film encapsulation layer TFE disposed on the display element layer DP-OLED.

The display panel DP' may be a flexible display panel. In an embodiment, for example, the substrate SUB may include a flexible plastic material such as polyimide ("PI"). The circuit element layer DP-CL and the display element layer DP-OLED may have the same arrangement structure as the circuit element layer DP-CL and the display element layer DP-OLED illustrated in FIG. 3.

The thin film encapsulation layer TFE may be disposed on the circuit element layer DP-CL to cover the display element layer DP-OLED. The thin film encapsulation layer TFE may include inorganic layers and an organic layer between the inorganic layers. The inorganic layers may protect pixels from moisture/oxygen. The organic layer may protect the pixels from foreign matter such as dust particles. Although not illustrated, the input sensing unit ISP illustrated in FIG. 2 may be directly disposed on the thin film encapsulation layer TFE.

Figure 5:
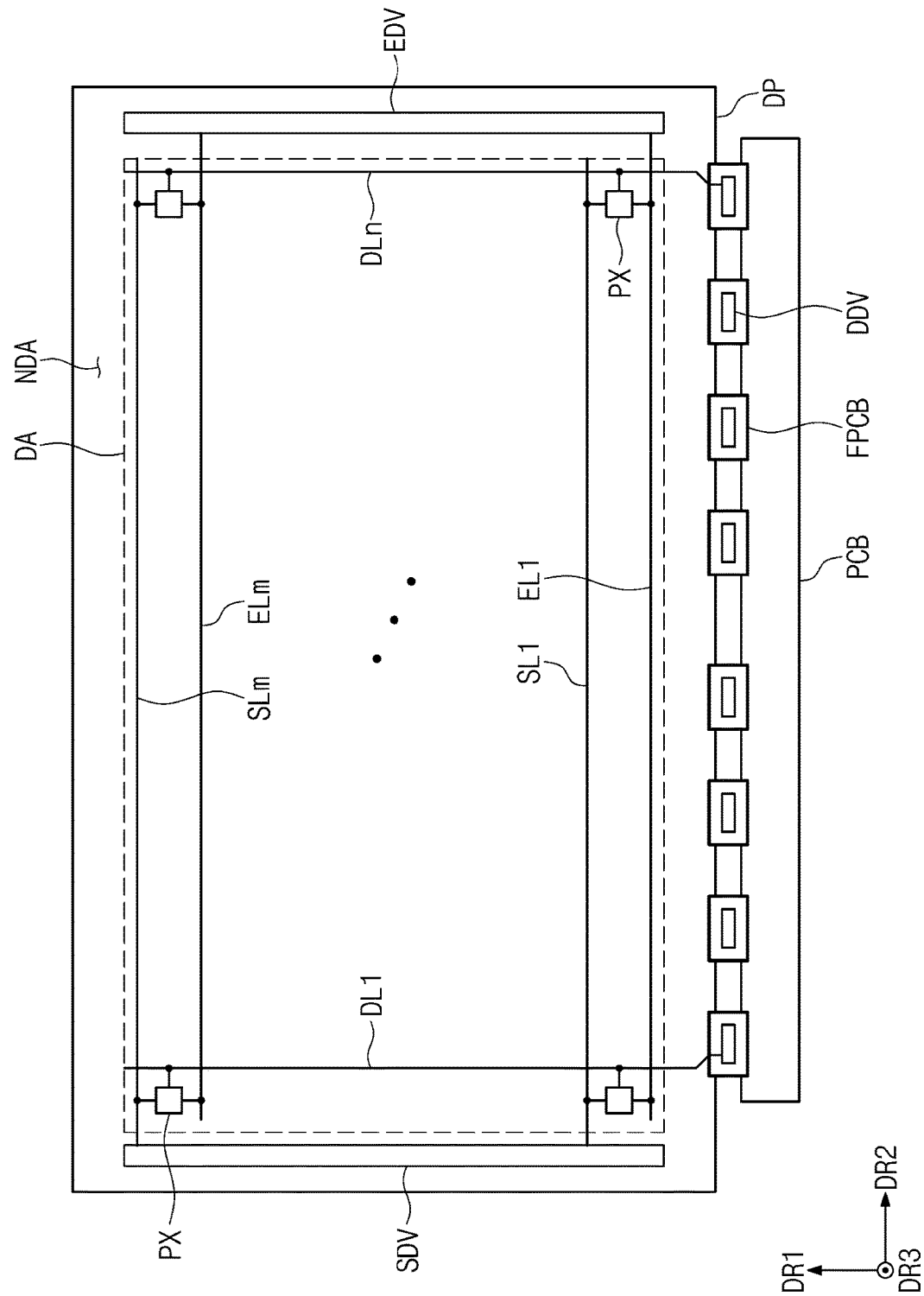
FIG. 5 is a plan view of the display panel illustrated in FIG. 2.

FIG. 5 is a plan view of the display panel illustrated in FIG. 2. As used herein, the "plan view" is a view in a thickness direction (i.e., DR3) of the display panel.

Referring to FIG. 5, the display device DD may include the display panel DP, a scan driver SDV, a plurality of data drivers DDV, a plurality of flexible circuit boards FPCB, an emission driver EDV, and a printed circuit board PCB.

The display panel DP may include a display region DA and a non-display region NDA surrounding the display region DA. The display region DA and the non-display region NDA of the display panel DP may correspond to the display region DA and the non-display region NDA illustrated in FIG. 2. The display panel DP may have a rectangular shape with long sides extending in the second direction DR2 and short sides extending in the first direction DR1. However, the shape of the display panel DP is not limited thereto.

The display panel DP may include a plurality of pixels PX, a plurality of scan lines SL1 to SLm, a plurality of data lines DL1 to DLn, and a plurality of emission lines EL1 to ELm. "m" and "n" are natural numbers.

The pixels PX may be disposed in the display region DA. The scan driver SDV and the emission driver EDV may be disposed in the non-display regions NDA adjacent to the short sides of the display panel DP, respectively.

The pixels PX may include a plurality of first pixels (reference numeral not illustrated), a plurality of second pixels (reference numeral not illustrated), and a plurality of third pixels (reference numeral not illustrated). The first pixels may emit red light, the second pixels may emit green light, and the third pixels may emit blue light.

The data drivers DDV, when viewed from above the plane, may be disposed adjacent to a lower side of the display panel DP that is defined as one of the long sides of the display panel DP. The printed circuit board PCB, when viewed from above the plane, may be disposed adjacent to the lower side of the display panel DP. The flexible circuit boards FPCB may be connected to the lower side of the display panel DP and the printed circuit board PCB. The data drivers DDV may be manufactured in the form of an integrated circuit chip and may be mounted on the respective flexible circuit boards FPCB.

The scan lines SL1 to SLm may extend in the second direction DR2 and may be connected to the pixels PX and the scan driver SDV. The emission lines EL1 to ELm may extend in the second direction DR2 and may be connected to the pixels PX and the emission driver EDV.

The data lines DL1 to DLn may extend in the first direction DR1 and may be connected to the pixels PX and the data drivers DDV. In an embodiment, for example, two data lines DL1 and DLn connected to the leftmost and rightmost data drivers DDV are illustrated. However, substantially, a plurality of data lines may be connected to each of the data drivers DDV.

Although not illustrated, the display device DD may further include a timing controller for controlling operations of the scan driver SDV, the data drivers DDV, and the emission driver EDV. The timing controller may be manufactured in the form of an integrated circuit chip and may be mounted on the printed circuit board PCB. The timing controller may be connected to the data drivers DDV, the scan driver SDV, and the emission driver EDV through the printed circuit board PCB and the flexible circuit boards FPCB.

The scan driver SDV may generate a plurality of scan signals, and the scan signals may be applied to the pixels PX through the scan lines SL1 to SLm. The data drivers DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The pixels PX may receive the data voltages in response to the scan signals. The pixels PX may display an image by emitting light having luminance corresponding to the data voltages in response to the emission signals. The light emission time of the pixels PX may be controlled by the emission signals.

Figure 6:
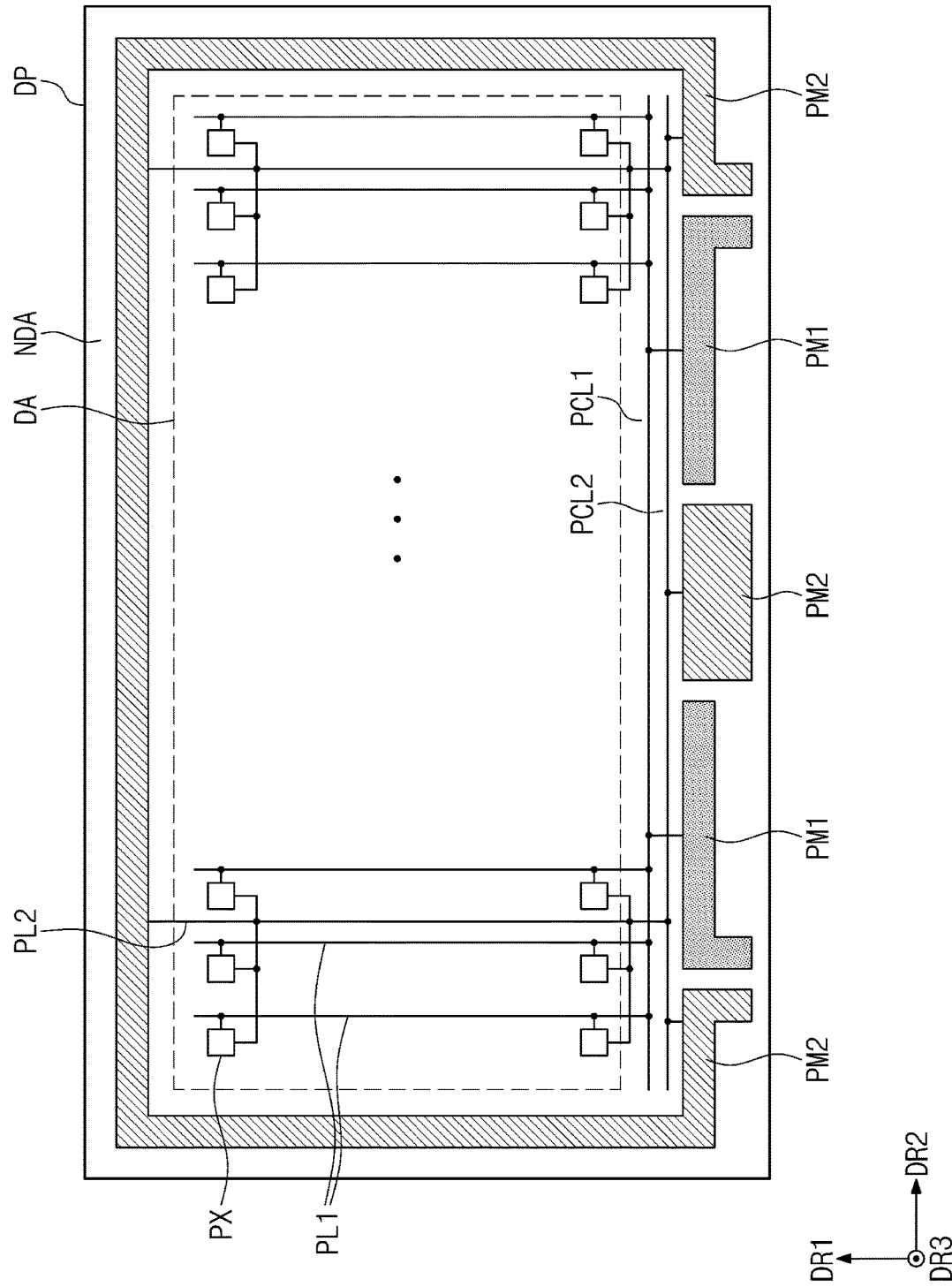
FIG. 6 is a view illustrating first power lines and second power lines disposed in the display panel illustrated in FIG. 5.

FIG. 6 is a view illustrating first power lines and second power lines disposed in the display panel illustrated in FIG. 5.

For convenience of description, in FIG. 6, the pixels PX, the first and second power lines PL1 and PL2, first and second common lines PCL1 and PCL2, and first and second power metals PM1 and PM2 are illustrated, and other lines are omitted.

Referring to FIG. 6, the display panel DP may include the plurality of first and second power lines PL1 and PL2, the plurality of first and second common lines PCL1 and PCL2, and the plurality of first and second power metals PM1 and PM2.

The first power lines PL1 may extend in the first direction DR1 in the display region DA and may be arranged in the second direction DR2. The first power lines PL1 may be connected to the pixels PX. The first power lines PL1 may be connected to anodes of light emitting elements of the pixels PX.

The second power lines PL2 may extend in the first direction DR1 in the display region DA and may be arranged in the second direction DR2. The second power lines PL2 may extend toward the pixels PX and be connected to the pixels PX. The second power lines PL2 may be connected to cathodes of the light emitting elements of the pixels PX.

The first common line PCL1, when viewed from above the plane, may be disposed in the non-display region NDA adjacent to the lower side of the display panel DP. The first common line PCL1 may extend in the second direction DR2. The first common line PCL1 may be connected to the first power lines PL1.

The second common line PCL2, when viewed from above the plane, may be disposed in the non-display region NDA adjacent to the lower side of the display panel DP. The second common line PCL2 may extend in the second direction DR2 and may be spaced apart from the first common line PCL1 in the first direction DR1. The second common line PCL2 may be connected to the second power lines PL2.

The first power metals PM1 may be disposed in the non-display region NDA. The first power metals PM1, when viewed from above the plane, may be disposed in the non-display region NDA adjacent to the lower side of the display panel DP. The first power metals PM1 may be spaced apart from each other in the second direction DR2. Although two first power metals PM1 are illustrated, the number of first power metals PM1 is not limited thereto.

The first common line PCL1 may be connected to the first power metals PM1. The first power metals PM1 may receive a first voltage. Accordingly, the first voltage may be applied to the pixels PX through the first power metals PM1, the first common line PCL1, and the first power lines PL1.

The second power metals PM2 may be disposed in the non-display region NDA. The second power metals PM2, when viewed from above the plane, may be disposed in the non-display region NDA adjacent to the lower side of the display panel DP. One second power metal PM2 may be disposed between the first power metals PM1. Another second power metal PM2 may be disposed outward of the first power metals PM1 in the second direction DR2 and may extend along the border of the display region DA to surround the left and right sides and the upper side of the display region DA.

The second common line PCL2 may be connected to the second power metals PM2. The second power lines PL2 may be connected to the second power metal PM2 disposed in the non-display region NDA adjacent to the upper side of the display panel DP. The second power metals PM2 may receive a second voltage. Accordingly, the second voltage may be applied to the pixels PX through the second power metals PM2, the second common line PCL2, and the second power lines PL2.

Figure 7:
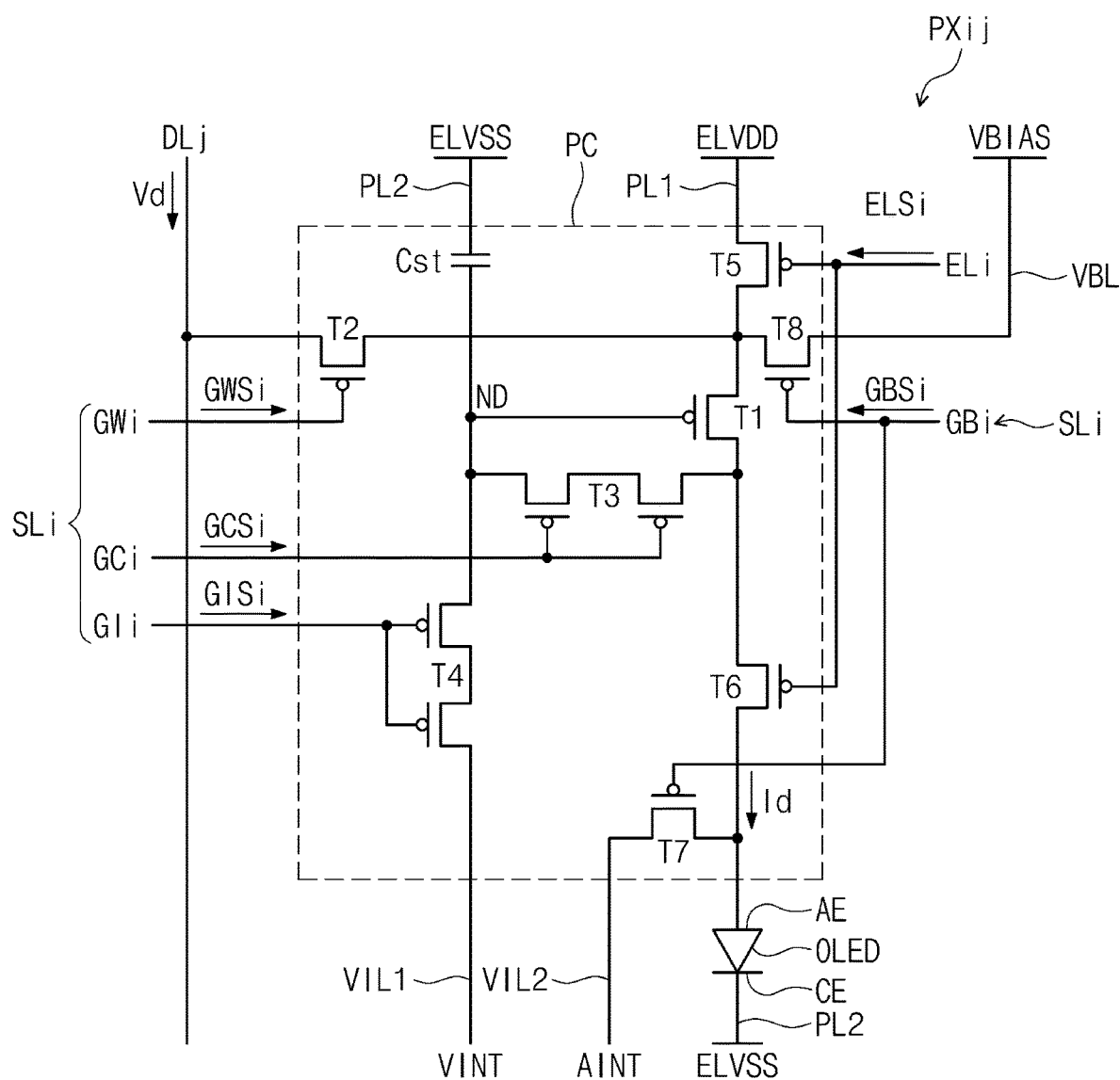
FIG. 7 is a view illustrating an equivalent circuit of any one pixel illustrated in FIG. 6.
Figure 8:
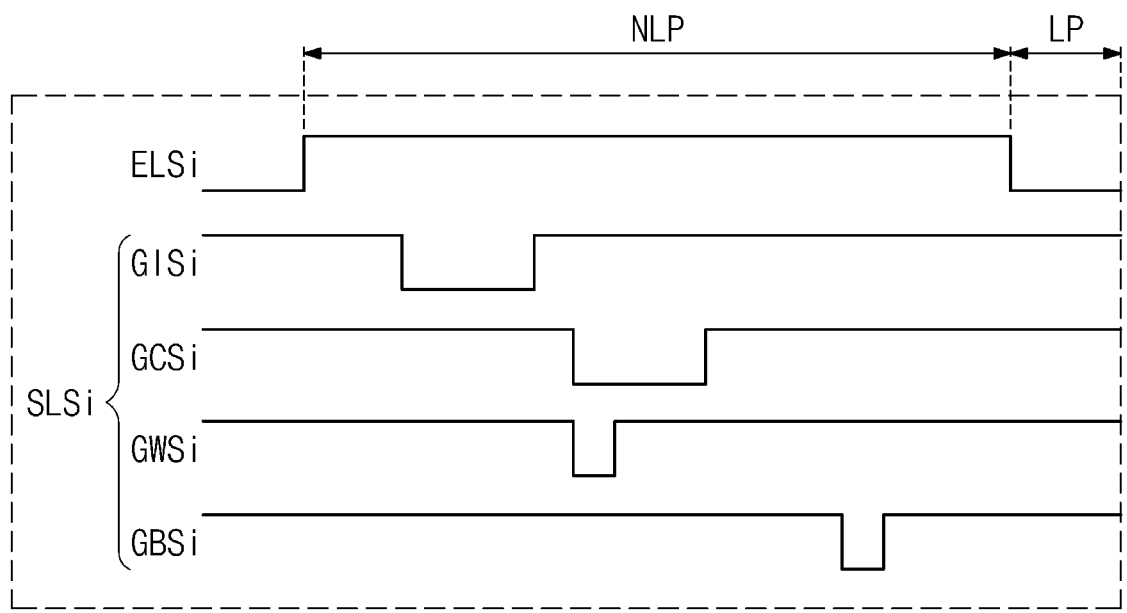
FIG. 8 is a timing chart of signals for driving the pixel illustrated in FIG. 7.

FIG. 7 is a view illustrating an equivalent circuit of any one pixel illustrated in FIG. 6. FIG. 8 is a timing chart of signals for driving the pixel illustrated in FIG. 7.

In an embodiment, for example, a pixel PXij connected to the i-th scan line SLi, the i-th emission line ELi, and the j-th data line DLj is illustrated in FIG. 7. "i" and "j" are natural numbers.

Referring to FIG. 7, the pixel PXij may be connected to the first power line PL1 and the second power line PL2. The first power line PL1 may receive the first voltage ELVDD, and the second power line PL2 may receive the second voltage ELVSS having a lower level than the first voltage ELVDD. The first voltage ELVDD may be applied to the pixel PXij through the first power line PL1. The second voltage ELVSS may be applied to the pixel PXij through the second power line PL2.

The pixel PXij may include a pixel circuit PC and a light emitting element OLED connected to the pixel circuit PC. The pixel circuit PC may drive the light emitting element OLED.

The pixel circuit PC may include a plurality of transistors T1 to T8 and a capacitor Cst. The transistors T1 to T8 and the capacitor Cst may control the amount of current flowing through the light emitting element OLED. The light emitting element OLED may generate light having a predetermined luminance depending on the amount of current provided thereto.

The i-th scan line SLi may include the i-th write scan line GWi, the i-th compensation scan line GCi, the i-th initialization scan line GIi, and the i-th bias scan line GBi.

The i-th write scan line GWi may receive the i-th write scan signal GWSi, and the i-th compensation scan line GCi may receive the i-th compensation scan signal GCSi. The i-th initialization scan line GIi may receive the i-th initialization scan signal GISi, and the i-th bias scan line GBi may receive the i-th bias scan signal GBSi. The i-th emission line ELi may receive the i-th emission signal ELSi.

Each of the transistors T1 to T8 may include a source electrode, a drain electrode, and a gate electrode. Hereinafter, in FIG. 7, for convenience, one of the source electrode and the drain electrode is defined as a first electrode, and the other is defined as a second electrode. In addition, the gate electrode is defined as a control electrode.

The transistors T1 to T8 may include the first to eighth transistors T1 to T8. The transistors T1 to T8 may include PMOS transistors. However, without being limited thereto, the transistors T1 to T8 may include NMOS transistors.

The first transistor T1 may be defined as a drive transistor, and the second transistor T2 may be defined as a switching transistor. The third transistor T3 may be defined as a compensation transistor. The fourth transistor T4 and the seventh transistor T7 may be defined as initialization transistors. The fifth transistor T5 and the sixth transistor T6 may be defined as emission control transistors. The eighth transistor T8 may be defined as a bias transistor.

The light emitting element OLED may be defined as an organic light emitting element. The light emitting element OLED may include an anode AE and a cathode CE. The anode AE may be connected to the first power line PL1 through the sixth, first, and fifth transistors T6, T1, and T5. The anode AE may receive the first voltage ELVDD through the sixth, first, and fifth transistors T6, T1, and T5.

The cathode CE may be connected to the second power line PL2. The cathode CE may receive the second voltage ELVSS through the second power line PL2.

The first transistor T1 may be connected to the anode AE and the first power line PL1 and may be switched by a voltage of a node ND. The first transistor T1 may be disposed between the fifth transistor T5 and the sixth transistor T6. The first transistor T1 may be connected to the first power line PL1 through the fifth transistor T5 and may be connected to the anode AE through the sixth transistor T6.

The first transistor T1 may include the first electrode connected to the first power line PL1 through the fifth transistor T5, the second electrode connected to the anode AE through the sixth transistor T6, and the control electrode connected to the node ND. The first electrode of the first transistor T1 may be connected to the fifth transistor T5, and the second electrode of the first transistor T1 may be connected to the sixth transistor T6. The first transistor T1 may control the amount of current flowing through the light emitting element OLED depending on the voltage of the node ND.

The second transistor T2 may be connected to the first transistor T1 and the data line DLj and may be switched by the write scan signal GWSi. The second transistor T2 may include the first electrode connected to the data line DLj, the second electrode connected to the first electrode of the first transistor T1, and the control electrode connected to the j-th write scan line GWi.

The second transistor T2 may be turned on by the i-th write scan signal GWSi applied through the i-th write scan line GWi and may electrically connect the data line DLj and the first electrode of the first transistor T1. The second transistor T2 may perform a switching operation of providing a data voltage Vd applied through the data line DLj to the first electrode of the first transistor T1.

The third transistor T3 may be connected to the node ND and the anode AE and may be switched by the compensation scan signal GCSi. The third transistor T3 may be connected to the anode AE through the sixth transistor T6. The third transistor T3 may include the first electrode connected to the second electrode of the first transistor T1, the second electrode connected to the node ND, and the control electrode connected to the i-th compensation scan line GCi.

The third transistor T3 may be turned on by the i-th compensation scan signal GCSi applied through the i-th compensation scan line GCi and may electrically connect the second electrode of the first transistor T1 and the control electrode of the first transistor T1. When the third transistor T3 is turned on, the first transistor T1 and the third transistor T3 may be connected in a diode form.

The third transistor T3 may be implemented in a dual gate structure for reducing leakage current. In the dual gate structure, two gate electrodes (control electrodes) may be connected with each other to have the same potential, and a channel length may be longer than that in a single gate structure. Because the resistance is increased when the channel length is increased, leakage current may be decreased during turn-off, and thus stability of operation may be secured.

The fourth transistor T4 may be connected to the node ND and a first initialization line VIL1 and may be switched by the i-th initialization scan signal GISi. The fourth transistor T4 may include the first electrode connected to the node ND, the second electrode connected to the first initialization line VIL1, and the control electrode connected to the i-th initialization scan line GIi. The first initialization line VIL1 may receive a first initialization voltage VINT. The first initialization voltage VINT may have a level different from a voltage level of the first voltage ELVDD.

The fourth transistor T4 may be turned on by the i-th initialization scan signal GISi applied through the i-th initialization scan line GIi and may provide the first initialization voltage VINT applied through the first initialization line VIL1 to the node ND. Similarly to the third transistor T3, the fourth transistor T4 may be implemented in a dual gate structure for reducing leakage current.

The fifth transistor T5 may be connected to the first power line PL1 and the first transistor T1 and may be switched by the i-th emission signal ELSi. The fifth transistor T5 may include the first electrode connected to the first power line PL1, the second electrode connected to the first electrode of the first transistor T1, and the control electrode connected to the i-th emission line ELi.

The sixth transistor T6 may be connected between the first transistor T1 and the anode AE and may be switched by the i-th emission signal ELSi. The sixth transistor T6 may include the first electrode connected to the second electrode of the first transistor T1, the second electrode connected to the anode AE, and the control electrode connected to the i-th emission line ELi.

The fifth transistor T5 and the sixth transistor T6 may be turned on by the i-th emission signal ESi applied through the i-th emission line ELi. The first voltage ELVDD may be provided to the light emitting element OLED by the turned-on fifth transistor T5 and the turned-on six transistor T6, and drive current may flow through the light emitting element OLED. Accordingly, the light emitting element OLED may emit light.

The seventh transistor T7 may include the first electrode connected to the anode AE, the second electrode connected to a second initialization line VIL2, and the control electrode connected to the i-th bias scan line GBi. The second initialization line VIL2 may receive a second initialization voltage AINT. The second initialization voltage AINT may have a level different from a voltage level of the first voltage ELVDD.

The seventh transistor T7 may be turned on by the i-th bias scan signal GBSi applied through the i-th bias scan line GBi and may provide the second initialization voltage AINT applied through the second initialization line VIL2 to the anode AE of the light emitting element OLED.

In an embodiment of the present disclosure, the seventh transistor T7 may be omitted. In an embodiment of the present disclosure, the second initialization voltage AINT may have a level different from a voltage level of the first initialization voltage VINT. However, without being limited thereto, the second initialization voltage AINT may have the same level as the first initialization voltage VINT.

The seventh transistor T7 may improve the ability of the pixel PXij to express black. When the seventh transistor T7 is turned on, a parasitic capacitor (not illustrated) of the light emitting element OLED may be discharged. Accordingly, when black luminance is implemented, the light emitting element OLED does not emit light due to the leakage current of the first transistor T1, and thus the ability to express black may be improved.

The capacitor Cst may include a first electrode connected to the second power line PL2 and a second electrode connected to the node ND. When the fifth transistor T5 and the sixth transistor T6 are turned on, the amount of current flowing through the first transistor T1 may be determined depending on a voltage stored in the capacitor Cst.

The eighth transistor T8 may include the first electrode connected to a bias line VBL that receives a bias voltage VBIAS, the second electrode connected to the first electrode of the first transistor T1, and the control electrode connected to the i-th bias scan line GBi. The eighth transistor T8 may be turned on by the i-th bias scan signal GBSi and may provide the bias voltage VBIAS to the first electrode of the first transistor T1.

Hereinafter, operation of the pixel PXij will be described in more detail with reference to the timing chart of FIG. 8. In FIG. 8, a low level may be defined as an activated signal, and a high level may be defined as a deactivated signal.

Referring to FIGS. 7 and 8, the i-th emission signal ELSi may be deactivated during a non-light emission period NLP and may be activated during a light emission period LP. In an embodiment, for example, an activation period of the i-th initialization scan signal GISi and an activation period of the i-th compensation scan signal GCSi may be greater than an activation period of the i-th write scan signal GWSi and an activation period of the i-th bias scan signal GBSi.

After the i-th initialization scan signal GISi is activated, the i-th write scan signal GWSi and the i-th compensation scan signal GCSi may be activated. Then, the i-th bias scan signal GBSi may be activated. Thereafter, the i-th emission signal ELSi may be activated.

The i-th initialization scan signal GISi, the i-th compensation scan signal GCSi, the i-th write scan signal GWSi, and the i-th bias scan signal GBSi may be defined as the i-th scan signal SLSi. That is, the i-th scan signal SLSi may include the i-th initialization scan signal GISi, the i-th compensation scan signal GCSi, the i-th write scan signal GWSi, and the i-th bias scan signal GBSi. The i-th scan line SLi may receive the i-th scan signal SLSi.

During the light emission period LP, the i-th initialization scan signal GISi, the i-th write scan signal GWSi, the i-th compensation scan signal GCSi, and the i-th bias scan signal GBSi that are activated may be applied to the pixel PXij.

Hereinafter, an operation of applying each signal to a transistor may indicate an operation of applying an activated signal to the transistor.

The i-th initialization scan signal GISi may be applied to the fourth transistor T4, and the fourth transistor T4 may be turned on. The first initialization voltage VINT may be provided to the node ND through the fourth transistor T4. The first initialization voltage VINT may be applied to the control electrode of the first transistor T1, and the first transistor T1 may be initialized by the first initialization voltage VINT. This operation may be defined as an initialization operation.

Next, the i-th write scan signal GWSi may be applied to the second transistor T2, and the second transistor T2 may be turned on. Furthermore, the i-th compensation scan signal GCSi may be applied to the third transistor T3, and the third transistor T3 may be turned on.

The first transistor T1 and the third transistor T3 may be turned on and connected in a diode form. In this case, a compensation voltage Vd−Vth obtained by subtracting the threshold voltage Vth of the first transistor T1 from the data voltage Vd supplied through the data line DLj may be applied to the control electrode of the first transistor T1.

This operation may be defined as a threshold voltage compensation operation for the first transistor T1, and the threshold voltage compensation operation may be performed by the third transistor T3. When the threshold voltage Vth of the first transistor T1 is compensated for, drive current Id may be determined irrespective of the threshold voltage Vth of the first transistor T1. This operation will be described below in detail.

The second voltage ELVSS and the compensation voltage Vd-Vth may be applied to the first electrode and the second electrode of the capacitor Cst, respectively. Charges corresponding to the difference between the voltage of the first electrode of the capacitor Cst and the voltage of the second electrode of the capacitor Cst may be stored in the capacitor Cst.

Then, the i-th bias scan signal GBSi may be applied to the seventh and eighth transistors T7 and T8, and the seventh and eighth transistors T7 and T8 may be turned on. The second initialization voltage AINT may be provided to the anode AE through the seventh transistor T7, and the anode AE may be initialized to the second initialization voltage AINT. The bias voltage VBIAS may be applied to the first electrode of the first transistor T1 via the eighth transistor T8.

After that, the i-th emission signal ELSi may be applied to the fifth transistor T5 and the sixth transistor T6 through the i-th emission line ELi during the light emission period LP, and the fifth transistor T5 and the sixth transistor T6 may be turned on. In this case, the drive current Id corresponding to the difference between the voltage of the control electrode of the first transistor T1 and the first voltage ELVDD may be generated. The drive current Id may be provided to the light emitting element OLED through the sixth transistor T6, and the light emitting element OLED may emit light.

A source-gate voltage Vsg of the first transistor T1 during the light emission period LP may be defined as the difference between the first voltage ELVDD and the compensation voltage Vd-Vth as in Equation 1:

$$V_{sg} = ELVDD - (Vd - Vth) \quad \text{[Equation 1]}$$

The relationship between the current and the voltage of the first transistor T1 is given by Equation 2 below. Equation 2 expresses a current-voltage relationship for a general transistor:

$$Id = (1/2)\mu Cox(W/L)(Vsg - Vth)^2 \quad \text{[Equation 2]}$$

When Equation 1 is substituted into Equation 2, the threshold voltage Vth may be removed, and the drive current Id may be proportional to the square $(ELVDD-Vd)^2$ of the first voltage ELVDD minus the data voltage Vd. Accordingly, the threshold voltage compensation operation may be performed by the third transistor T3, and the drive current Id may be determined irrespective of the threshold voltage Vth of the first transistor T1.

The bias voltage VBIAS may be applied to the first electrode of the first transistor T1 via the eighth transistor T8 before the light emitting element OLED emits light after the threshold voltage of the first transistor T1 is compensated for. Movement of a hysteresis curve of the first transistor T1 may be suppressed by the bias voltage VBIAS.

Figure 9:
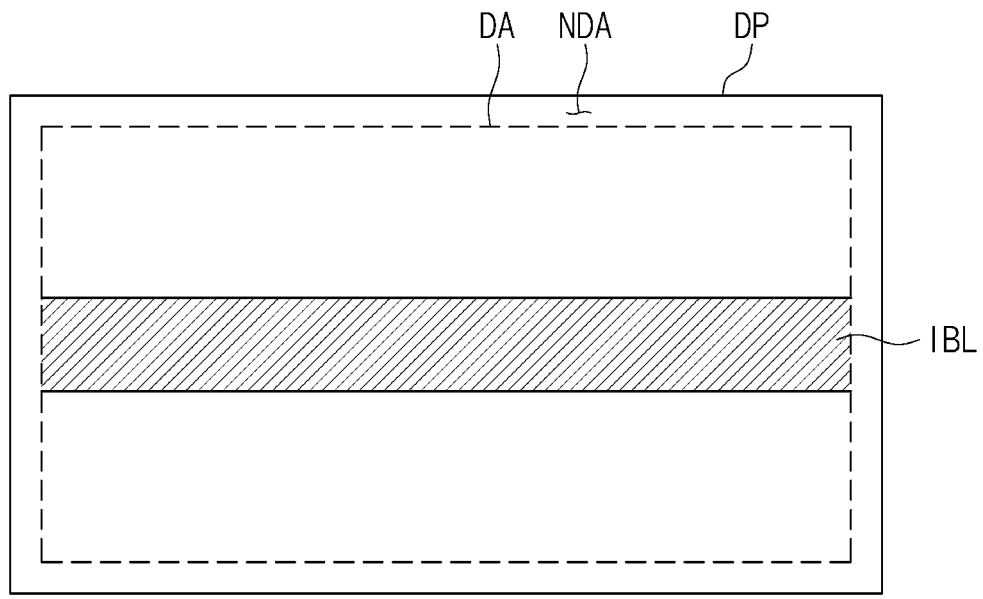
FIG. 9 is a view illustrating a display state of a partial region of the display panel illustrated in FIG. 5.
Figure 9:
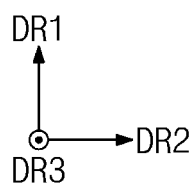
Figure 10:
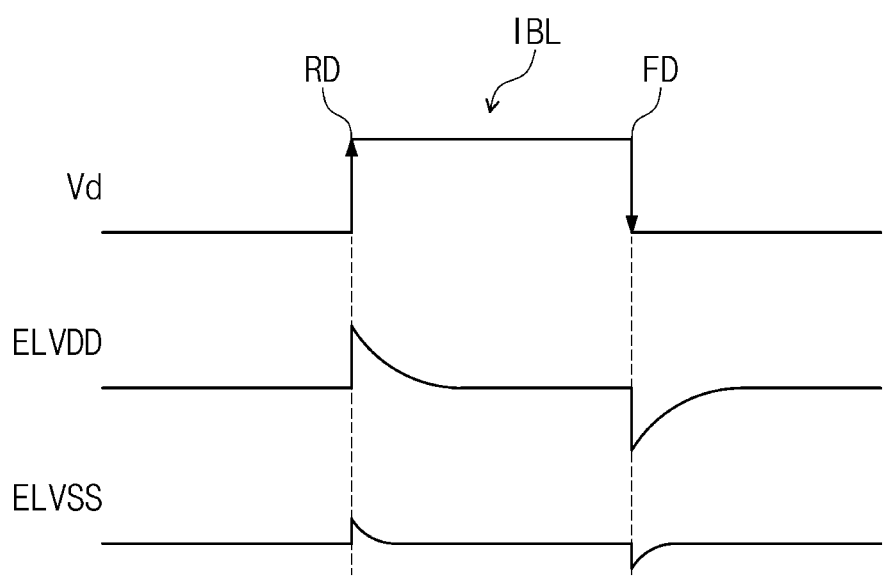
FIG. 10 is a view illustrating a data voltage applied to a black display region illustrated in FIG. 9 and first and second voltages varying depending on the data voltage.

FIG. 9 is a view illustrating a display state of a partial region of the display panel illustrated in FIG. 5. FIG. 10 is a view illustrating the data voltage applied to a black display region illustrated in FIG. 9 and the first and second voltages varying depending on the data voltage.

Referring to FIG. 9, the gray scale of the partial region of the display panel DP may be significantly different from those of other regions. In an embodiment, for example, the partial region of the display panel DP may display a black image, and the region of the display panel DP may be defined as the black display region IBL.

Referring to FIGS. 9 and 10, the data voltage Vd applied to the black display region IBL may be greatly varied when compared to the data voltage Vd applied to the other regions. In this case, the first voltage ELVDD and the second voltage ELVSS may vary depending on the variation of the data voltage Vd without maintaining constant levels at a rising edge RD of the data voltage Vd and a falling edge FD of the data voltage Vd.

The first voltage ELVDD may vary at the rising edge RD and the falling edge FD of the data voltage Vd depending on a coupling phenomenon of a parasitic capacitor formed by the first power line PL1. The second voltage ELVSS may vary at the rising edge RD and the falling edge FD of the data voltage Vd depending on a coupling phenomenon of a parasitic capacitor formed by the second power line PL2.

The first and second voltages ELVDD and ELVSS may temporarily rise at the riding edge RD of the data voltage Vd and may return to normal levels after a predetermined period of time passes. In addition, the first and second voltages ELVDD and ELVSS may temporarily fall at the falling edge FD of the data voltage Vd and may return to the normal levels after a predetermined period of time passes.

The capacitance of the parasitic capacitor formed by the first power line PL1 may be greater than the capacitance of the parasitic capacitor formed by the second power line PL2. Accordingly, as illustrated in FIG. 10, the variation of the first voltage ELVDD may be greater than the variation of the second voltage ELVSS.

The capacitance of the parasitic capacitor formed by the first power line PL1 and the capacitance of the parasitic capacitor formed by the second power line PL2 will be described below in detail with reference to layout drawings of FIGS. 13A to 13E.

Figure 11:
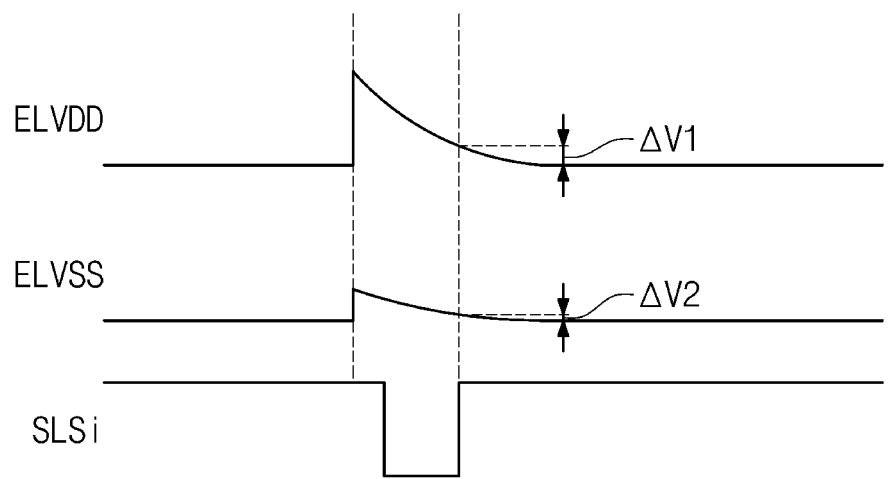
FIG. 11 is a view illustrating rising portions of the first and second voltages illustrated in FIG. 10 and any scan signal.

FIG. 11 is a view illustrating rising portions of the first and second voltages illustrated in FIG. 10 and any scan signal.

Referring to FIGS. 10 and 11, the scan signal SLSi may be applied to the corresponding scan line SLi before the first and second voltages ELVDD and ELVSS return to the normal levels after varied depending on the variation of the data voltage Vd.

The scan signal SLSi includes the i-th initialization scan signal GISi, the i-th compensation scan signal GCSi, the i-th write scan signal GWSi, and the i-th bias scan signal GBSi described above and is illustrated as a single pulse for convenience of description.

Because the first voltage ELVDD is not returned to the normal level during a light emission operation, a first voltage difference ΔV1 between the level of the first voltage ELVDD at the end of the scan signal SLSi and the normal level of the first voltage ELVDD may be generated. In addition, because the second voltage ELVSS is not returned to the normal level during the light emission operation, a second voltage difference ΔV2 between the level of the second voltage ELVSS at the end of the scan signal SLSi and the normal level of the second voltage ELVSS may be generated.

The first voltage difference ΔV1 may be greater than the second voltage difference ΔV2 because the variation of the first voltage ELVDD is greater than the variation of the second voltage ELVSS. The first voltage difference ΔV1 and the second voltage difference ΔV2 may affect operation of the pixel PXij.

Referring to FIGS. 7 and 11, when the first electrode of the capacitor Cst is connected to the first power line PL1 rather than the second power line PL2, the source-gate voltage Vsg of the first transistor T1 may be ELVDD−(Vd−Vth−ΔV1) unlike in Equation 1. In this case, the drive current Id may be proportional to $(ELVDD-Vd+\Delta V1)^2$ according to Equation 2.

The variation of the drive current Id may also be increased depending on the first voltage difference ΔV1 greater than the second voltage difference ΔV2. Accordingly, normal drive current may not flow through the pixel PXij, and therefore an image may not be normally displayed.

In an embodiment of the present disclosure, when the first electrode of the capacitor Cst is connected to the second power line PL2, the source-gate voltage Vsg of the first transistor T1 may be ELVDD−(Vd−Vth−ΔV2). In this case, the drive current Id may be proportional to (ELVDD−Vd+ ΔV2)² according to Equation 2.

The second voltage difference ΔV2 may be smaller than the first voltage difference ΔV1. Specifically, the second voltage difference ΔV2 may be smaller than at least half of the first voltage difference ΔV1. The variation of the drive current Id may be minimized depending on the second voltage difference ΔV2 smaller than the first voltage difference ΔV1. Accordingly, when the pixel PXij is driven depending on the second voltage difference ΔV2 rather than the first voltage difference ΔV1, an image may be normally displayed.

That is, because the capacitor Cst is connected to the second power line PL2 rather than the first power line PL1, the display device DD may normally display an image.

The second power line PL2 may be defined as a "constant voltage line" that applies a constant voltage level to the pixel PXij. The capacitor Cst may normally operate only when a constant voltage is applied to the first electrode of the capacitor Cst. However, as described above, the voltage level may be varied by the variation of the data voltage Vd and the parasitic capacitors. In an embodiment of the present disclosure, the variation of the level of the voltage applied to the first electrode of the capacitor Cst may be minimized, and thus the pixel PXij may be more normally driven.

Figure 12:
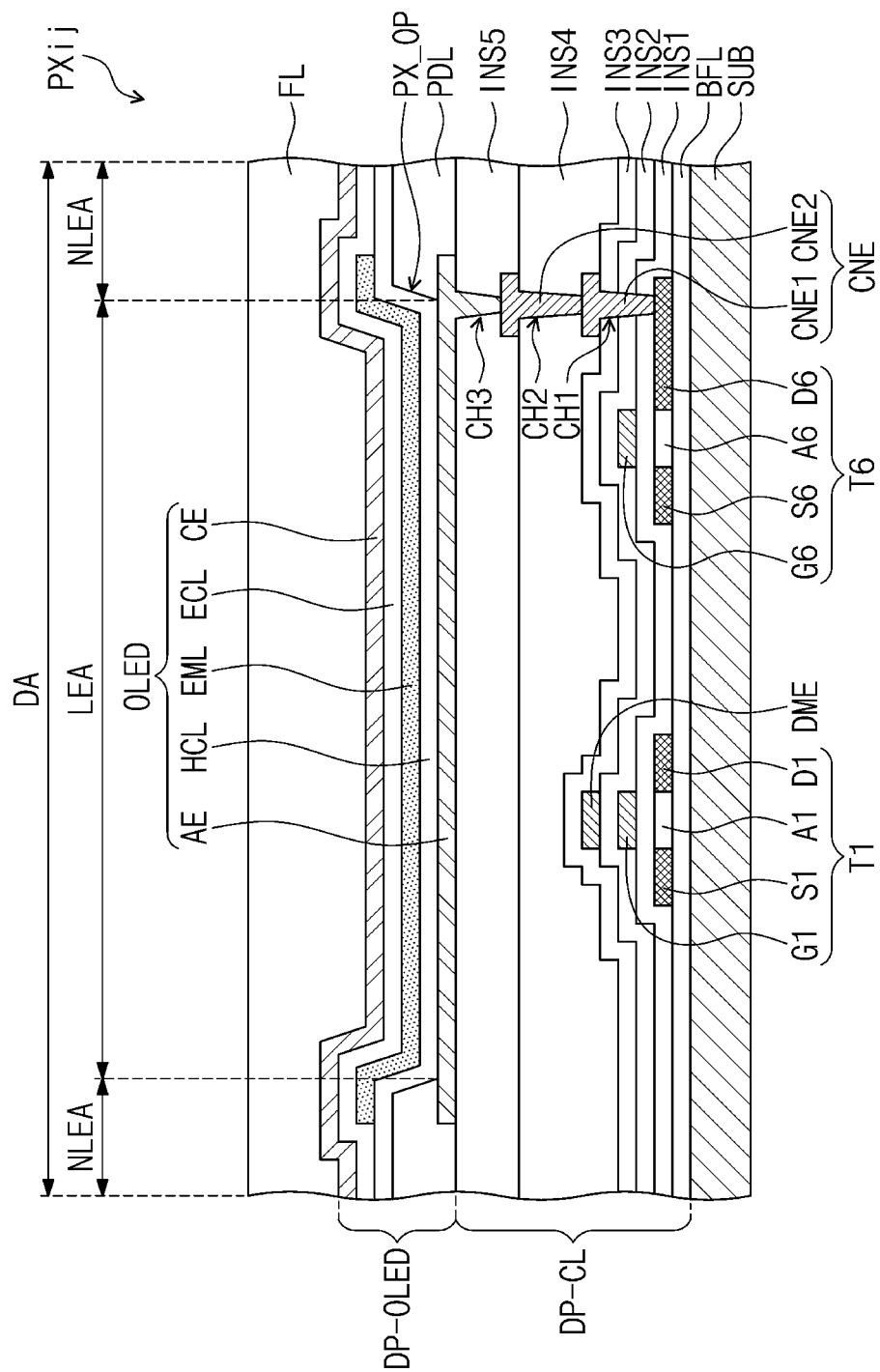
FIG. 12 is a sectional view illustrating a light emitting element, a first transistor, and a sixth transistor of the pixel illustrated in FIG. 7.

FIG. 12 is a sectional view illustrating the light emitting element, the first transistor, and the sixth transistor of the pixel illustrated in FIG. 7.

Referring to FIG. 12, the light emitting element OLED may include the first electrode AE, the second electrode CE, a hole control layer HCL, an electron control layer ECL, and an emissive layer EML. The first electrode AE may be the anode AE illustrated in FIG. 7, and the second electrode CE may be the cathode CE illustrated in FIG. 7. The second electrode CE may be disposed over the first electrode AE, and the hole control layer HCL, the electron control layer ECL, and the emissive layer EML may be disposed between the first electrode AE and the second electrode CE.

The first and sixth transistors T1 and T6 and the light emitting element OLED may be disposed on the substrate SUB. The display region DA may include an emissive region LEA corresponding to the pixel PXij and a non-emissive region NLEA adjacent to the emissive region LEA. The light emitting element OLED may be disposed in the emissive region LEA.

A buffer layer BFL may be disposed on the substrate SUB. The buffer layer BFL may be an inorganic layer. A semiconductor layer S1, A1, and D1 of the first transistor T1 and a semiconductor layer S6, A6, and D6 of the sixth transistor T6 may be disposed on the buffer layer BFL. The semiconductor layers S1, A1, D1, S6, A6, and D6 may include poly silicon. However, without being limited thereto, the semiconductor layers S1, A1, D1, S6, A6, and D6 may include amorphous silicon.

The semiconductor layers S1, A1, D1, S6, A6, and D6 may be doped with an N-type dopant or a P-type dopant. The semiconductor layers S1, A1, D1, S6, A6, and D6 may include heavily doped regions and lightly doped regions. The heavily doped regions (e.g., source regions and drain regions) may have higher conductivity than the lightly doped regions and may substantially serve as the source electrodes and the drain electrodes of the first and sixth transistors T1 and T6. The lightly doped regions may substantially correspond to channel regions (or, channels) of the first and sixth transistors T1 and T6.

The first source region S1, the first channel region A1, and the first drain region D1 of the first transistor T1 may be formed from the semiconductor layer S1, A1, and D1. The sixth source region S6, the sixth channel region A6, and the sixth drain region D6 of the sixth transistor T6 may be formed from the semiconductor layer S6, A6, and D6. The first channel region A1 may be disposed between the first source region S1 and the first drain region D1. The sixth channel region A6 may be disposed between the sixth source region S6 and the sixth drain region D6.

A first insulating layer INS1 may be disposed on the buffer layer BFL to cover the semiconductor layers S1, A1, D1, S6, A6, and D6. The first and sixth gate electrodes G1 and G6 (or, the control electrodes) of the first and sixth transistors T1 and T6 may be disposed on the first insulating layer INS1.

Although not illustrated, the other transistors T2 to T5, T7, and T8 may also have substantially the same configuration as the first and sixth transistors T1 and T6.

A second insulating layer INS2 may be disposed on the first insulating layer INS1 to cover the first and sixth gate electrodes G1 and G6. A dummy electrode DME may be disposed on the second insulating layer INS2. The dummy electrode DME may be disposed over the first gate electrode G1 and may overlap the first gate electrode G1 when viewed from above the plane (i.e., in a plan view).

The dummy electrode DME may form the above-described capacitor Cst together with the first gate electrode G1. The dummy electrode DME may define the first electrode of the capacitor Cst, and the first gate electrode G1 may define the second electrode of the capacitor Cst.

A third insulating layer INS3 may be disposed on the second insulating layer INS2 to cover the dummy electrode DME. The buffer layer BFL and the first to third insulating layers INS1 to INS3 may include inorganic layers.

A connecting electrode CNE may be disposed between the sixth transistor T6 and the light emitting element OLED. The connecting electrode CNE may electrically connect the sixth transistor T6 and the light emitting element OLED. The connecting electrode CNE may include a first connecting electrode CNE1 and a second connecting electrode CNE2 disposed on the first connecting electrode CNE1.

The first connecting electrode CNE1 may be disposed on the third insulating layer INS3 and may be connected to the sixth drain region D6 through a first contact hole CH1 defined in the first to third insulating layers INS1 to INS3. A fourth insulating layer INS4 may be disposed on the third insulating layer INS3 to cover the first connecting electrode CNE1.

The second connecting electrode CNE2 may be disposed on the fourth insulating layer INS4. The second connecting electrode CNE2 may be connected to the first connecting electrode CNE1 through a second contact hole CH2 defined in the fourth insulating layer INS4. A fifth insulating layer INS5 may be disposed on the fourth insulating layer INS4 to cover the second connecting electrode CNE2. The fourth and fifth insulating layers INS4 and INS5 may include an inorganic layer or an organic layer.

The first electrode AE may be disposed on the fifth insulating layer INS5. The first electrode AE may be electrically connected to the second connecting electrode CNE2 through a third contact hole CH3 defined in the fifth insulating layer INS5.

A pixel defining layer PDL exposing a predetermined portion of the first electrode AE may be disposed on the first electrode AE and the fifth insulating layer INS5. An opening PX-OP for exposing the predetermined portion of the first electrode AE may be defined in the pixel defining layer PDL.

The hole control layer HCL may be disposed on the first electrode AE and the pixel defining layer PDL. The hole control layer HCL may be commonly disposed in the emissive region LEA and the non-emissive region NLEA. The hole control layer HCL may include a hole transport layer and a hole injection layer.

The emissive layer EML may be disposed on the hole control layer HCL. The emissive layer EML may be disposed in a region corresponding to the opening PX_OP. The emissive layer EML may include an organic material and/or an inorganic material. The emissive layer EML may generate one of red light, green light, and blue light.

The electron control layer ECL may be disposed on the emissive layer EML and the hole control layer HCL. The electron control layer ECL may be commonly disposed in the emissive region LEA and the non-emissive region NLEA. The electron control layer ECL may include an electron transport layer and an electron injection layer.

The second electrode CE may be disposed on the electron control layer ECL. The second electrode CE may be commonly disposed in the pixels PX. That is, the second electrode CE may be commonly disposed over the emissive layers EML of the pixels PX. A filler FL may be disposed on the light emitting element OLED.

The layers from the buffer layer BFL to the fifth insulating layer INS5 may be defined as the circuit element layer DP-CL. The layer in which the light emitting element OLED is disposed may be defined as the display element layer DP-OLED.

The first voltage ELVDD may be applied to the first electrode AE, and the second voltage EVLSS may be applied to the second electrode CE. Holes and electrons injected into the emissive layer EML may be combined to form excitons, and the light emitting element OLED may emit light as the excitons transition to a ground state. An image may be displayed as the light emitting element OLED emits the light.

FIGS. 13A to 13E are views illustrating a planar structure of the pixel circuit illustrated in FIG. 7 in stages.

FIGS. 13A to 13E may be defined as layout drawings of the pixel circuit PC. In description of FIGS. 13A to 13E, the term "overlap" indicates a state in which components overlap each other when viewed from above a plane. Hereinafter, when lines illustrated in FIGS. 13A to 13E are referred to, the designation "i-th" will be omitted.

Figure 13A:
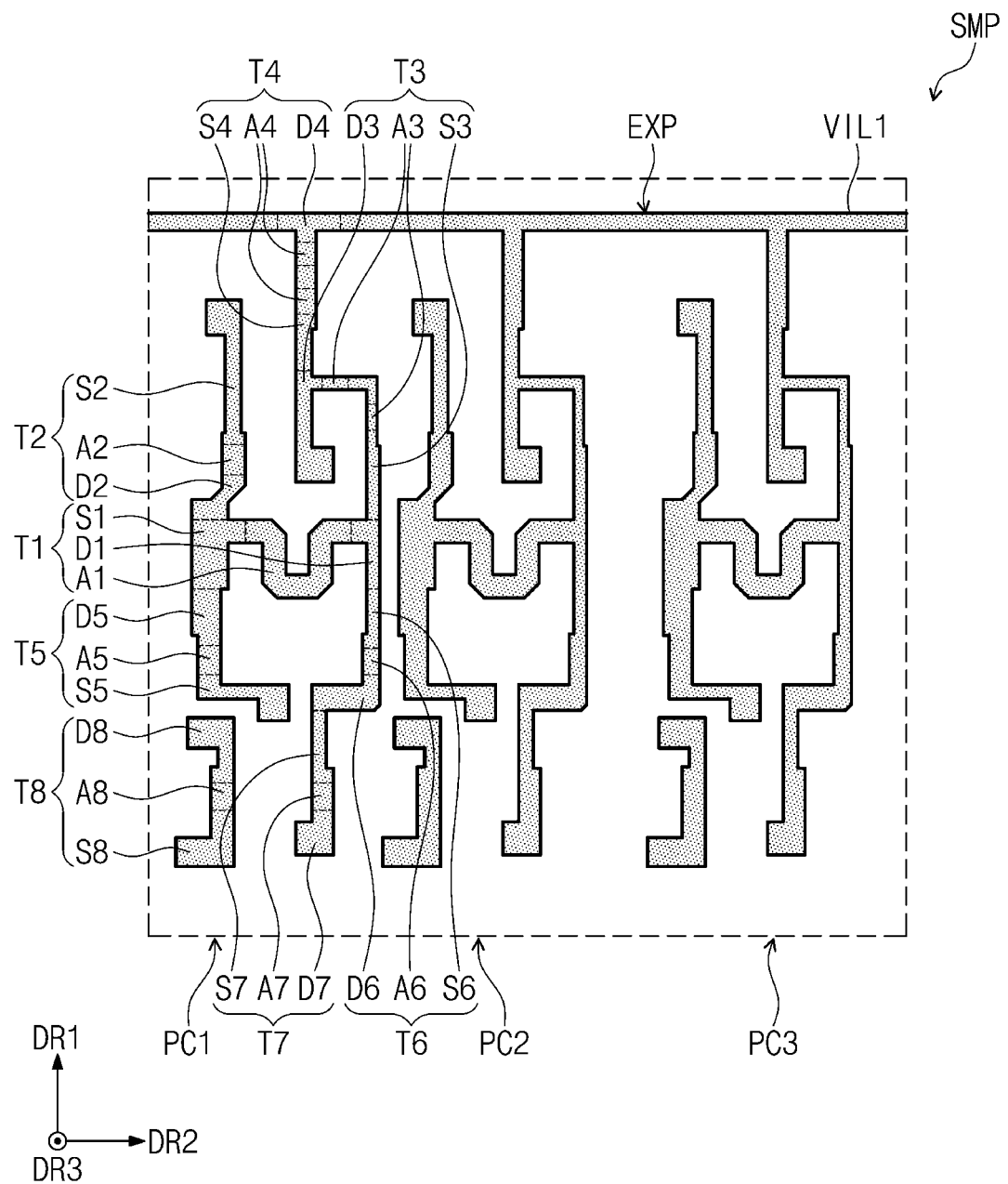
FIGS. 13A to 13E are views illustrating a planar structure of a pixel circuit illustrated in FIG. 7 in stages.

Referring to FIG. 13A, each of the first pixels described with reference to FIG. 5 may include a first pixel circuit PC1, each of the second pixels described with reference to FIG. 5 may include a second pixel circuit PC2, and each of the third pixels described with reference to FIG. 5 may include a third pixel circuit PC3. In an embodiment, for example, three pixel circuits, that is, the first pixel circuits PC1, the second pixel circuit PC2, and the third pixel circuit PC3 are illustrated in FIG. 13A. The first pixel circuits PC1, the second pixel circuit PC2, and the third pixel circuit PC3 may be arranged in the second direction DR2.

Each of the first, second, and third pixel circuits PC1, PC2, and PC3 may correspond to the pixel circuit PC illustrated in FIG. 7. Accordingly, each of the first, second, and third pixel circuits PC1, PC2, and PC3 may include the first to eighth transistors T1 to T8 and the capacitor Cst. The light emitting elements OLED may be connected to the first, second, and third pixel circuits PC1, PC2, and PC3, respectively.

Figure 13B:
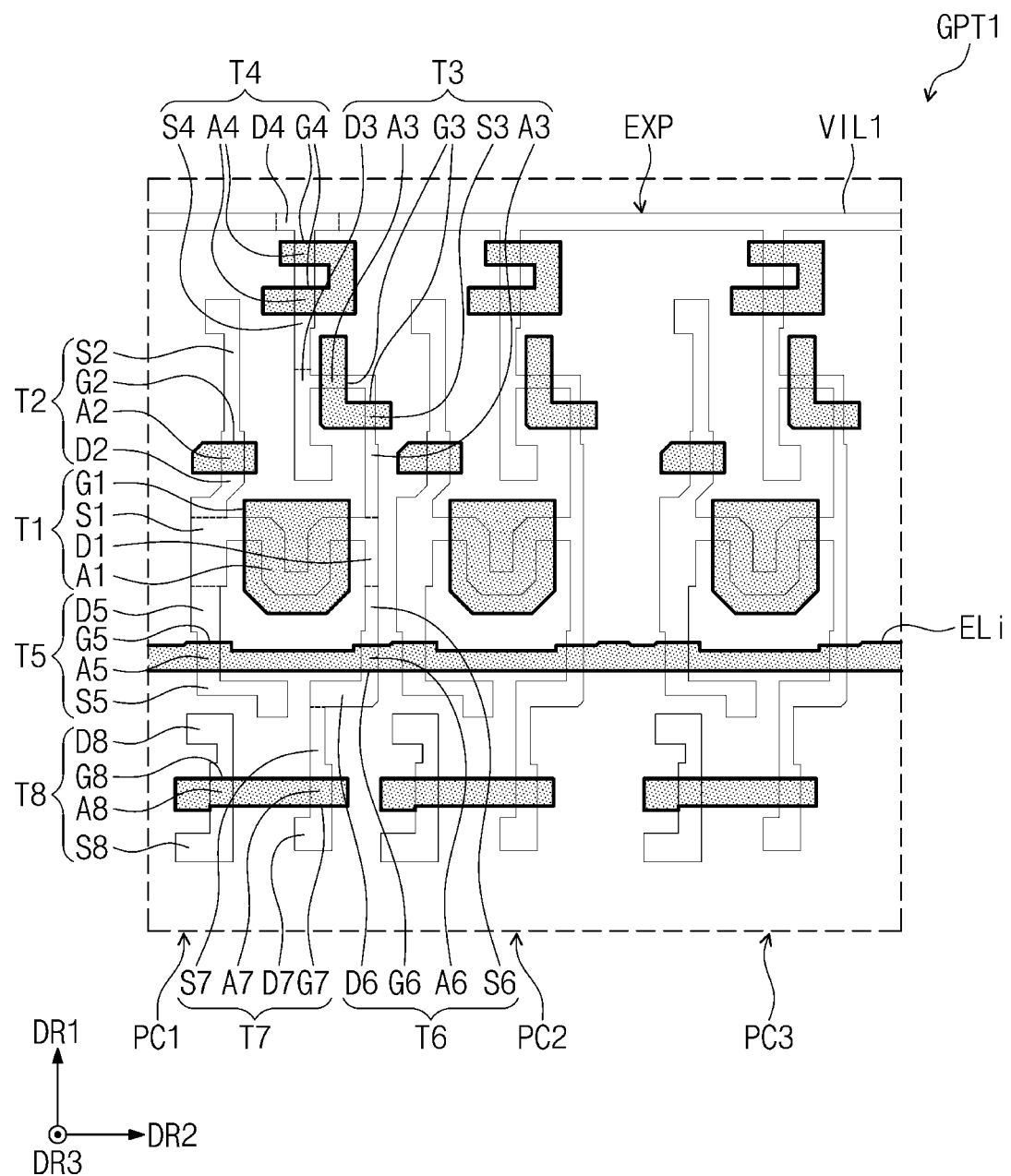
Figure 13C:
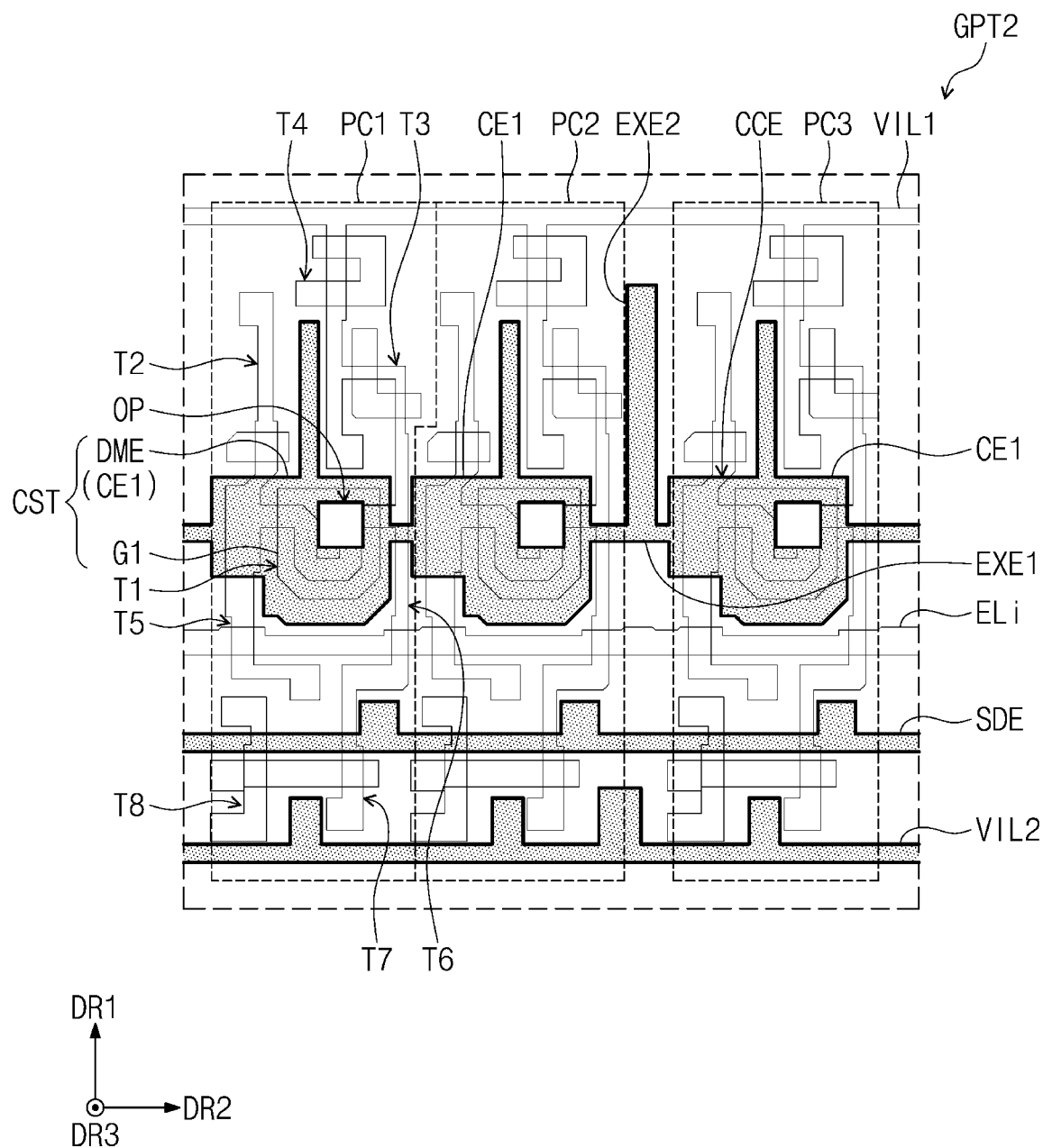

In an embodiment, for example, in FIG. 13C, the boundaries between the first, second, and third pixel circuits PC1, PC2, and PC3 are illustrated by dotted lines, and in FIGS. 13A, 13B, 13D, and 13E, the first, second, and third pixel circuits PC1, PC2, and PC3 are illustrated by arrows.

The first, second, and third pixel circuits PC1, PC2, and PC3 have substantially the same configuration, and therefore the configuration of the first pixel circuit PC1 will hereinafter be described.

A semiconductor pattern SMP may be disposed on the substrate SUB illustrated in FIG. 12. The semiconductor pattern SMP may have various shapes without being limited to the shape illustrated in FIG. 13A.

The first to eighth source regions S1 to S8, the first to eighth drain regions D1 to D8, and the first to eighth channel regions A1 to A8 of the first to eighth transistors T1 to T8 may be formed by the semiconductor pattern SMP. The first to eighth channel regions A1 to A8 may be disposed between the first to eighth source regions S1 to S8 and the first to eighth drain regions D1 to D8. The third transistor T3 having a dual gate structure may include two third channel regions A3, and the fourth transistor T4 having a dual gate structure may include two fourth channel regions A4.

The second drain region D2 of the second transistor T2 and the fifth drain region D5 of the fifth transistor T5 may extend from the first source region S1 of the first transistor T1. The sixth source region S6 of the sixth transistor T6 and the third source region S3 of the third transistor T3 may extend from the first drain region D1 of the first transistor T1.

The fourth source region S4 of the fourth transistor T4 may extend from the third drain region D3 of the third transistor T3. The seventh source region S7 of the seventh transistor T7 may extend from the sixth drain region D6 of the sixth transistor T6.

The eighth source region S8, the eighth drain region D8, and the eighth channel region A8 of the eighth transistor T8 may be adjacent to the semiconductor pattern SMP of the fifth transistor T5. The semiconductor pattern SMP of the eighth transistor T8 may be formed in an island shape.

The semiconductor pattern SMP extending from the fourth drain region D4 of the fourth transistor T4 may extend in the second direction DR2 and may be defined as an extension pattern EXP. The extension pattern EXP may receive the first initialization voltage VINT. The extension pattern EXP may be defined as the first initialization line VIL1.

Referring to FIGS. 13A and 13B, a first gate pattern GPT1 may be disposed on the semiconductor pattern SMP. The first gate pattern GPT1 may include the first to fourth gate electrodes G1 to G4, the seventh and eighth gate electrodes G7 and G8, and the emission line ELi.

The first to eighth gate electrodes G1 to G8 of the first to eighth transistors T1 to T8 may be formed by the first gate pattern GPT1. The first gate electrode G1 may overlap the first channel region A1, and the second gate electrode G2 may overlap the second channel region A2 in a plan view.

The third gate electrode G3 may overlap the third channel region A3, and the fourth gate electrode G4 may overlap the fourth channel region A4 in a plan view. The third transistor T3 having a dual gate structure may include two third gate electrodes G3, and the fourth transistor T4 having a dual gate structure may include two fourth gate electrodes G4.

The emission line ELi may extend in the second direction DR2. The emission line ELi may extend to cross the semiconductor pattern SMP of the fifth transistor T5 and the semiconductor pattern SMP of the sixth transistor T6.

The fifth gate electrode G5 of the fifth transistor T5 and the sixth gate electrode G6 of the sixth transistor T6 may be formed by the emission line ELi. Portions of the emission line ELi that overlap the semiconductor pattern SMP when viewed from above the plane may be defined as the fifth and sixth gate electrodes G5 and G6.

The seventh gate electrode G7 may overlap the seventh channel region A7, and the eighth gate electrode G8 may overlap the eighth channel region A8 in a plan view.

Figure 13D:
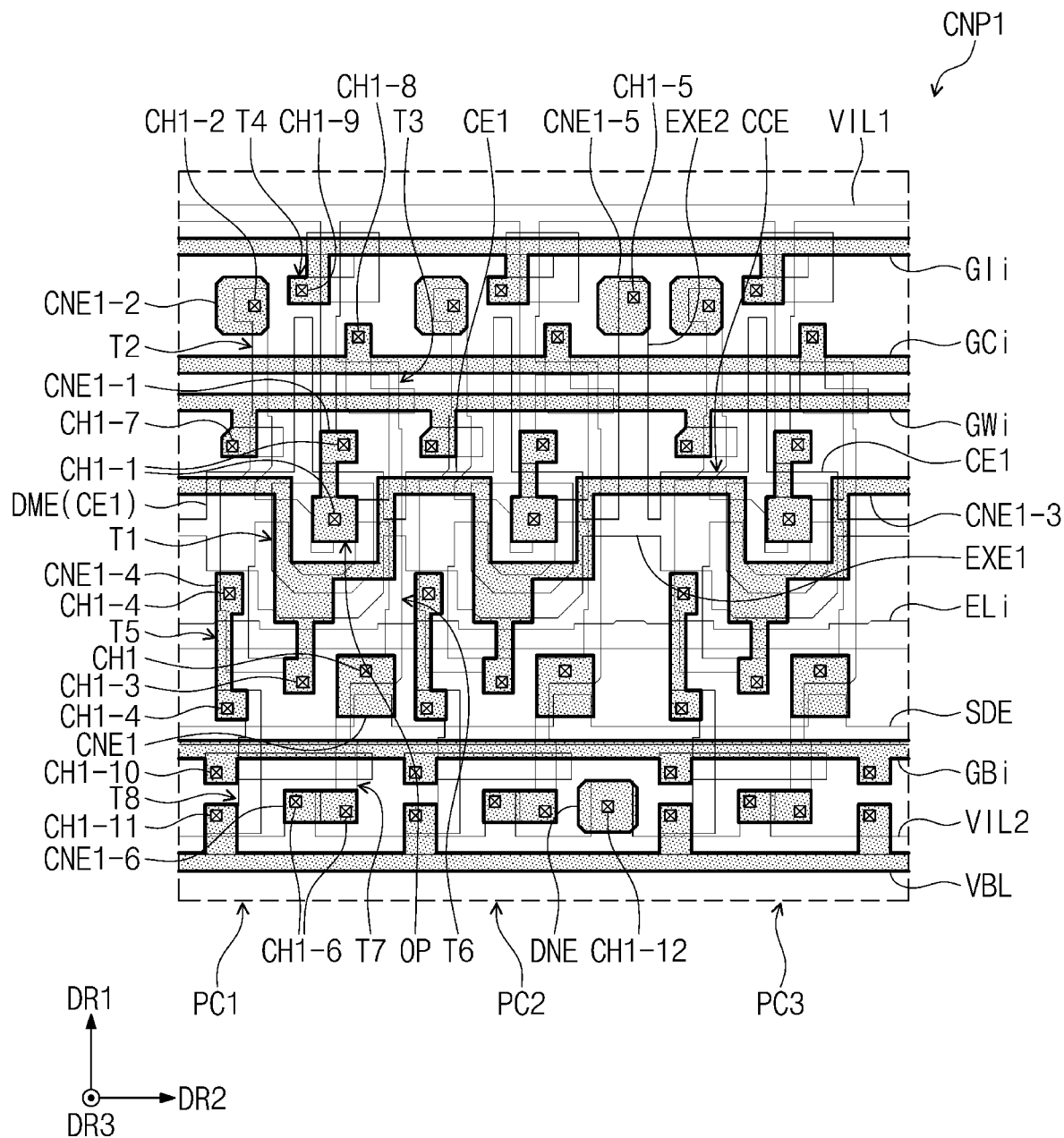
Figure 13E:
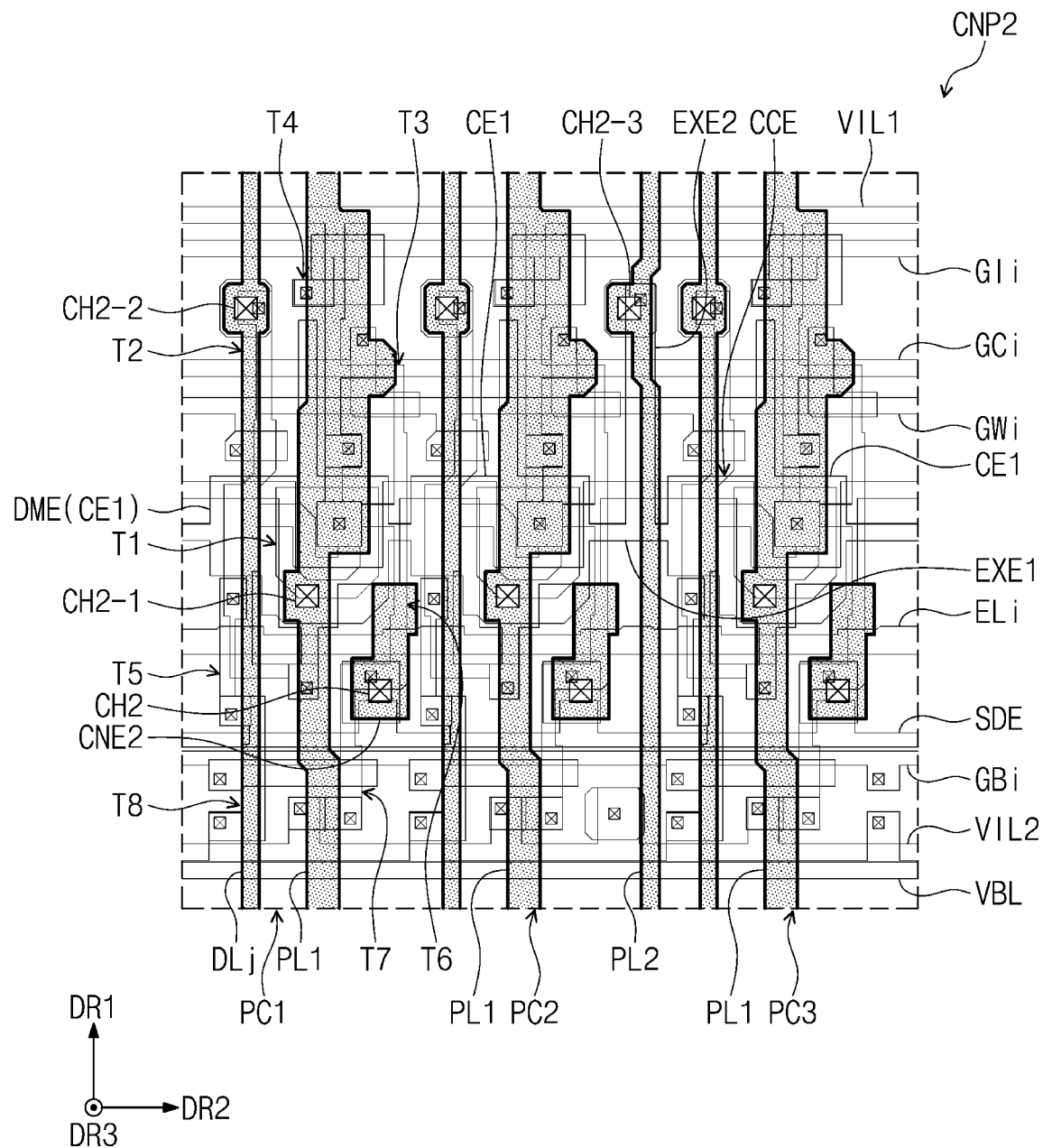

In FIGS. 13C to 13E, for convenience of description and simplicity of reference numerals, the reference numerals of the source regions, the drain regions, the channel regions, and the gate electrodes of the first to eighth transistors T1 to T8 will be omitted, and the reference numerals of the first to eighth transistors T1 to T8 will be illustrated. In addition, in FIGS. 13C to 13E, the reference numeral of the extension pattern EXP is also omitted.

Referring to FIG. 13C, a second gate pattern GPT2 may be disposed on the first gate pattern GPT1. The second gate pattern GTP2 may include the dummy electrode DME, a sub-dummy electrode SDE, and the second initialization line VIL2.

The capacitor Cst may be formed by the dummy electrode DME and the first gate electrode G1. An opening OP may be defined in the dummy electrode DME. A portion of the first gate electrode G1 may be exposed by the opening OP.

The dummy electrode DME may form the first electrode CE1 of the capacitor Cst. That is, the dummy electrode DME may form the first electrodes CE1 of the capacitors Cst of the first, second, and third pixel circuits PC1, PC2, and PC3. The first gate electrode G1 may form the second electrode of the capacitor Cst.

The first electrode CE1 of the capacitor Cst of the second pixel circuit PC2 and the first electrode CE1 of the capacitor Cst of the third pixel circuit PC3 may extend in the first direction DR1 between the second pixel circuit PC2 and the third pixel circuit PC3.

The first electrodes CE1 may be arranged in the second direction DR2 and may be integrally formed (i.e., monolithic). The integrally formed first electrodes CE1 may be defined as a common capacitor electrode CCE. The common capacitor electrode CCE may extend in the first direction DR1 between the second pixel circuit PC2 and the third pixel circuit PC3.

The display device DD may include a first extension electrode EXE1 extending in the second direction DR2 and a second extension electrode EXE2 extending from the first extension electrode EXE1 in the first direction DR1.

The first extension electrode EXE1 may extend between the second pixel circuit PC2 and the third pixel circuit PC3 from the first electrode CE1 of the capacitor Cst of the second pixel circuit PC2 and the first electrode CE1 of the capacitor Cst of the third pixel circuit PC3. The second extension electrode EXE2 may extend in the first direction DR1 between the second pixel circuit PC2 and the third pixel circuit PC3.

The second initialization line VIL2 may extend in the second direction DR2. The second initialization line VIL2 may be connected to the seventh transistor T7. This structure will be described below with reference to FIG. 13D. The sub-dummy electrode SDE may extend in the second direction DR2 and may be disposed between the dummy electrode DME and the second initialization line VIL2.

Referring to FIG. 13D, a first connecting pattern CNP1 may be disposed on the second gate pattern GPT2. The first connecting pattern CNP1 may include a plurality of first connecting electrodes CNE1 and CNE1-1 to CNE1-6, the write scan line GWi, the initialization scan line GIi, the compensation scan line GCi, the bias scan line GBi, the bias line VBL, and a dummy connecting electrode DNE.

The write scan line GWi, the initialization scan line GIi, the compensation scan line GCi, the bias scan line GBi, and the bias line VBL may extend in the second direction DR2 and may be arranged in the first direction DR1.

The initialization scan line GIi may be adjacent to the first initialization line VIL1. The compensation scan line GCi may be disposed between the write scan line GWi and the initialization scan line GIi. The write scan line GWi may be disposed between the compensation scan line GCi and the bias scan line GBi. The bias scan line GBi may be disposed between the write scan line GWi and the bias line VBL.

The first connecting electrodes CNE1, CNE1-1, CNE1-3, and CNE1-4 may be disposed between the write scan line GWi and the bias scan line GBi. The first connecting electrode CNE1-2 may be disposed between the initialization scan line GIi and the compensation scan line GCi. The first connecting electrode CNE1-6 and the dummy connecting electrode DNE may be disposed between the bias scan line GBi and the bias line VBL.

The first connecting electrode CNE1 may be the first connecting electrode CNE1 illustrated in FIG. 12. The first connecting electrodes CNE1-1 to CNE1-6, the write scan line GWi, the initialization scan line GIi, the compensation scan line GCi, the bias scan line GBi, the bias line VBL, and the dummy connecting electrode DNE may be disposed in the same layer as the first connecting electrode CNE1 and may be simultaneously formed of the same material together with the first connecting electrode CNE1 by patterning.

A plurality of first contact holes CH1 and CH1-1 to CH1-12 may be defined. The first contact hole CH1 may be the first contact hole CH1 illustrated in FIG. 12. The first contact holes CH1-1 to CH1-12 may be formed to be substantially the same as the first contact hole CH1.

The first connecting electrode CNE1 may be connected to the sixth drain region D6 of the sixth transistor T6 through the first contact hole CH1.

The first connecting electrode CNE1-1 may be connected to the first gate electrode G1 of the first transistor T1, the third drain region D3 of the third transistor T3, and the fourth source region S4 of the fourth transistor T4 through the first contact holes CH1-1. The first connecting electrode CNE1-1 may be connected to the first gate electrode G1 through the first contact hole CH1-1 overlapping the opening OP in a plan view. The first transistor T1, the third transistor T3, and the fourth transistor T4 may be connected together by the first connecting electrode CNE1-1.

The first connecting electrode CNE1-2 may be connected to the second source region S2 of the second transistor T2 through the first contact hole CH1-2. The first connecting electrode CNE1-3 may be connected to the fifth source region S5 of the fifth transistor T5 through the first contact hole CH1-3. The first connecting electrode CNE1-3 may not be connected to the dummy electrode DME.

The first connecting electrode CNE1-4 may be connected to the fifth drain region D5 of the fifth transistor T5 and the eighth drain region D8 of the eighth transistor T8 through the first contact holes CH1-4. The fifth transistor T5 and the eighth transistor T8 may be connected together by the first connecting electrode CNE1-4.

The first connecting electrode CNE1-5 may be connected to the common capacitor electrode CCE through the first contact hole CH1-5. Specifically, the first connecting electrode CNE1-5 may be connected to the second extension electrode EXE2 through the first contact hole CH1-5. Accordingly, the dummy electrode DME may be connected to the first connecting electrode CNE1-5.

The first connecting electrode CNE1-6 may be connected to the second initialization line VIL2 and the seventh drain region D7 of the seventh transistor T7 through the first contact holes CH1-6. The second initialization line VIL2 may be connected to the seventh transistor T7 by the first connecting electrode CNE1-6.

The write scan line GWi may be connected to the second gate electrode G2 of the second transistor T2 through the first contact hole CH1-7. The compensation scan line GCi may be connected to the third gate electrode G3 of the third transistor T3 through the first contact hole CH1-8. The initialization scan line GIi may be connected to the fourth gate electrode G4 of the fourth transistor T4 through the first contact hole CH1-9.

The bias scan line GBi may be connected to the eighth gate electrode G8 of the eighth transistor T8 and the seventh gate electrode G7 of the seventh transistor T7 through the first contact hole CH1-10. The bias line VBL may be connected to the eighth source region S8 of the eighth transistor T8 through the first contact hole CH1-11.

The dummy connecting electrode DNE may be connected to the second initialization line VIL2 through the first contact hole CH1-12.

In FIG. 13E, for simplicity of reference numerals, the reference numerals of the first connecting electrodes CNE1 and CNE1-1 to CNE1-6, the first contact holes CH1 and CH1-1 to CH1-12, and the dummy connecting electrode DNE will be omitted.

Referring to FIGS. 13C, 13D, and 13E, a second connecting pattern CNP2 may be disposed on the first connecting pattern CNP1. The second connecting pattern CNP2 may include the second connecting electrode CNE2, the first power line PL1, the data line DLj, and the second power line PL2.

The second connecting electrode CNE2 may be the second connecting electrode CNE2 illustrated in FIG. 12. The first power line PL1, the data line DLj, and the second power line PL2 may be disposed in the same layer as the second connecting electrode CNE2 and may be simultaneously formed of the same material together with the second connecting electrode CNE2 by patterning.

A plurality of second contact holes CH2 and CH2-1 to CH2-3 may be defined. The second contact hole CH2 may be the second contact hole CH2 illustrated in FIG. 12. The second contact holes CH2-1 to CH2-3 may be formed to be substantially the same as the second contact hole CH2.

The first power line PL1, the data line DLj, and the second power line PL2 may extend in the first direction DR1. The data line DLj may be disposed adjacent to the first power line PL1. The second power line PL2, which is defined as a constant voltage line, may be disposed between the second pixel circuit PC2 and the third pixel circuit PC3. The second power line PL2 may not be disposed between the first pixel circuit PC1 and the second pixel circuit PC2.

A plurality of first power lines PL1 may be provided. The plurality of first power lines PL1 may extend in the first direction DR1 and may be arranged in the second direction DR2. The first power lines PL1 may be provided for the first, second, and third pixel circuits PC1, PC2, and PC3, respectively. The first power lines PL1 may overlap the capacitors Cst of the first, second, and third pixel circuits PC1, PC2, and PC3 illustrated in FIG. 13, respectively in a plan view.

The area of the second power line PL2 may be smaller than the area of each of the first power lines PL1 in a plan view. The first power lines PL1 having a larger area than the second power line PL2 may overlap the capacitors Cst having a larger area in a plan view. Accordingly, parasitic capacitance formed by the second power line PL2 may be smaller than parasitic capacitance formed by the first power line PL1.

The second connecting electrode CNE2 may be adjacent to the first power line PL1 provided for the first pixel circuit PC1. The second connecting electrode CNE2 may be connected to the first connecting electrode CNE1 through the second contact hole CH2. Although not illustrated, the second connecting electrode CNE2 may be connected to the first electrode AE1 through the third contact hole CH3 described with reference to FIG. 12.

The first power line PL1 may be connected to the first connecting electrode CNE1-3 through the second contact hole CH2-1. The first power line PL1 may be connected to the fifth source region S5 of the fifth transistor T5 through the first connecting electrode CNE1-3. Because the first connecting electrode CNE1-3 is not connected to the dummy electrode DME, the first power line PL1 may also not be connected to the dummy electrode DME.

The data line DLj may be connected to the first connecting electrode CNE1-2 through the second contact hole CH2-2. The data line DLj may be connected to the second source region S2 of the second transistor T2 through the first connecting electrode CNE1-2.

The second power line PL2 may be connected to the first connecting electrode CNE1-5 through the second contact hole CH2-3. The second power line PL2 may be connected to the common capacitor electrode CCE through the first connecting electrode CNE1-5. Accordingly, the first and second extension electrodes EXE1 and EXE2 may be connected to the first electrode CE1 of the second pixel circuit PC2 and the first electrode CE1 of the third pixel circuit PC3, extend between the second pixel circuit PC2 and the third pixel circuit PC3, and may be connected to the second power line PL2 defined as a constant voltage line.

In an embodiment, for example, the first and second extension electrodes EXE1 and EXE2 connected to the common capacitor electrode CCE may extend in the first direction DR1 between the second pixel circuit PC2 and the third pixel circuit PC3 and may be connected to the second power line PL2. Specifically, the second extension electrode EXE2 may extend in the first direction DR1 between the second pixel circuit PC2 and the third pixel circuit PC3 and may connect the second power line PL2 to the common capacitor electrode CCE.

As described above, the capacitance of the parasitic capacitor formed by the first power line PL1 may be greater than the capacitance of the parasitic capacitor formed by the second power line PL2. As the capacitance of a parasitic capacitor is increased, a coupling phenomenon may significantly occur.

Because the capacitance of the parasitic capacitor formed by the first power line PL1 is greater than the capacitance of the parasitic capacitor formed by the second power line PL2, the first voltage ELVDD may be greatly varied as described above with reference to FIGS. 10 and 11 when the data voltage Vd varies. Because the capacitance of the parasitic capacitor formed by the second power line PL2 is smaller than the capacitance of the parasitic capacitor formed by the first power line PL1, the second voltage ELVSS may be less varied as described above with reference to FIGS. and 11 when the data voltage Vd varies.

Accordingly, the capacitor Cst may receive the second voltage ELVSS having less variability, and thus the display device DD may normally display an image.

Figure 14:
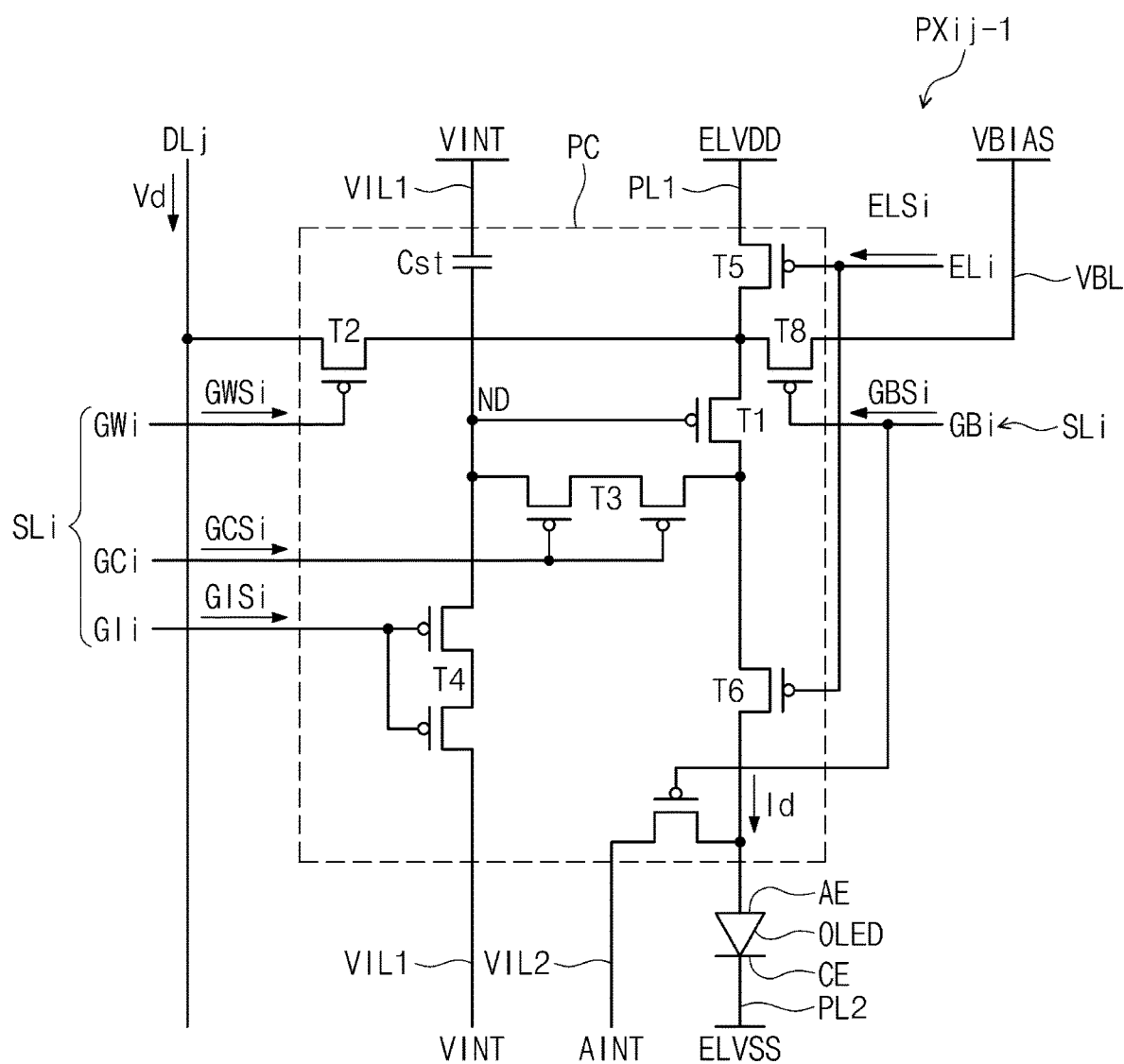
FIG. 14 is a view illustrating an equivalent circuit of a pixel according to another embodiment of the present disclosure.

FIG. 14 is a view illustrating an equivalent circuit of a pixel according to another embodiment of the present disclosure.

Hereinafter, the configuration of the pixel PXij-1 illustrated in FIG. 14 will be described. The following description will be focused on components different from the components illustrated in FIG. 7.

Referring to FIG. 14, a first electrode of a capacitor Cst may be connected to a first initialization line VIL1 and may receive a first initialization voltage VINT. The first initialization voltage VINT that is a constant voltage may be applied to the first electrode of the capacitor Cst. The first initialization line VIL1 may be defined as a constant voltage line. The other components of the pixel PXij-1 may be the same as the components of the pixel PXij illustrated in FIG. 7.

FIGS. 15A to 15D are layout drawings of a pixel circuit illustrated in FIG. 14.

Hereinafter, components illustrated in FIGS. 15A to 15D will be described. The following description will be focused on components different from the components illustrated in FIGS. 13A to 13E.

Figure 15A:
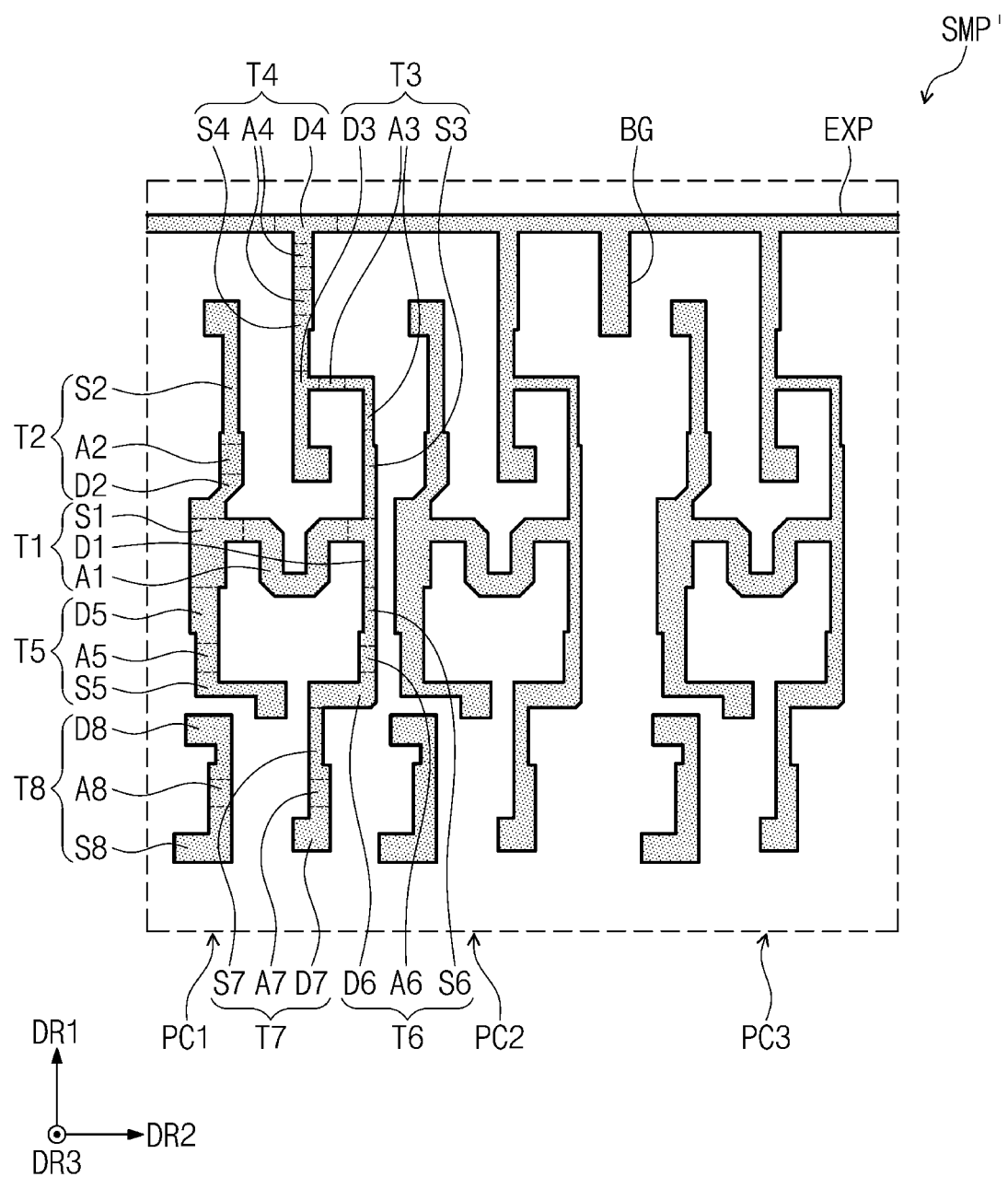
FIGS. 15A to 15D are layout drawings of a pixel circuit illustrated in FIG. 14.

Referring to FIG. 15A, a semiconductor pattern SMP' may include a branch portion BG that branches from an extension pattern EXP in the first direction DR1 and that is disposed between a second pixel circuit PC2 and a third pixel circuit PC3. The semiconductor pattern SMP' may be the same as the semiconductor pattern SMP illustrated in FIG. 13A, except for the branch portion BG. The extension pattern EXP may not be defined as the first initialization line VIL1.

Figure 15B:
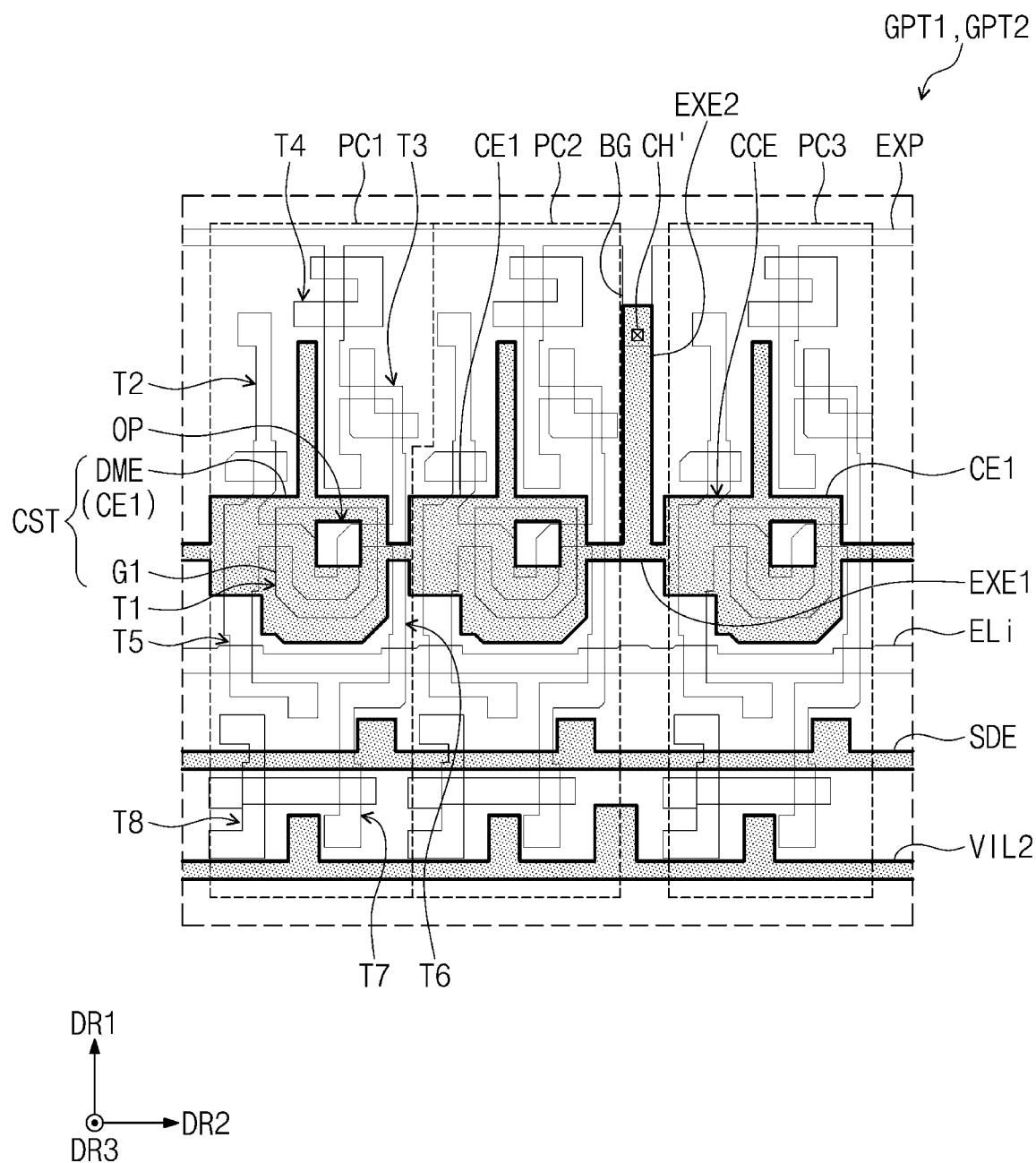

Referring to FIG. 15B, a first gate pattern GPT1 may be disposed on the semiconductor pattern SMP', and a second gate pattern GPT2 may be disposed on the first gate pattern GPT1. The first gate pattern GPT1 may have the same configuration as the first gate pattern GPT1 illustrated in FIG. 13B, and the second gate pattern GPT2 may have the same configuration as the second gate pattern GPT2 illustrated in FIG. 13C.

Figure 15C:
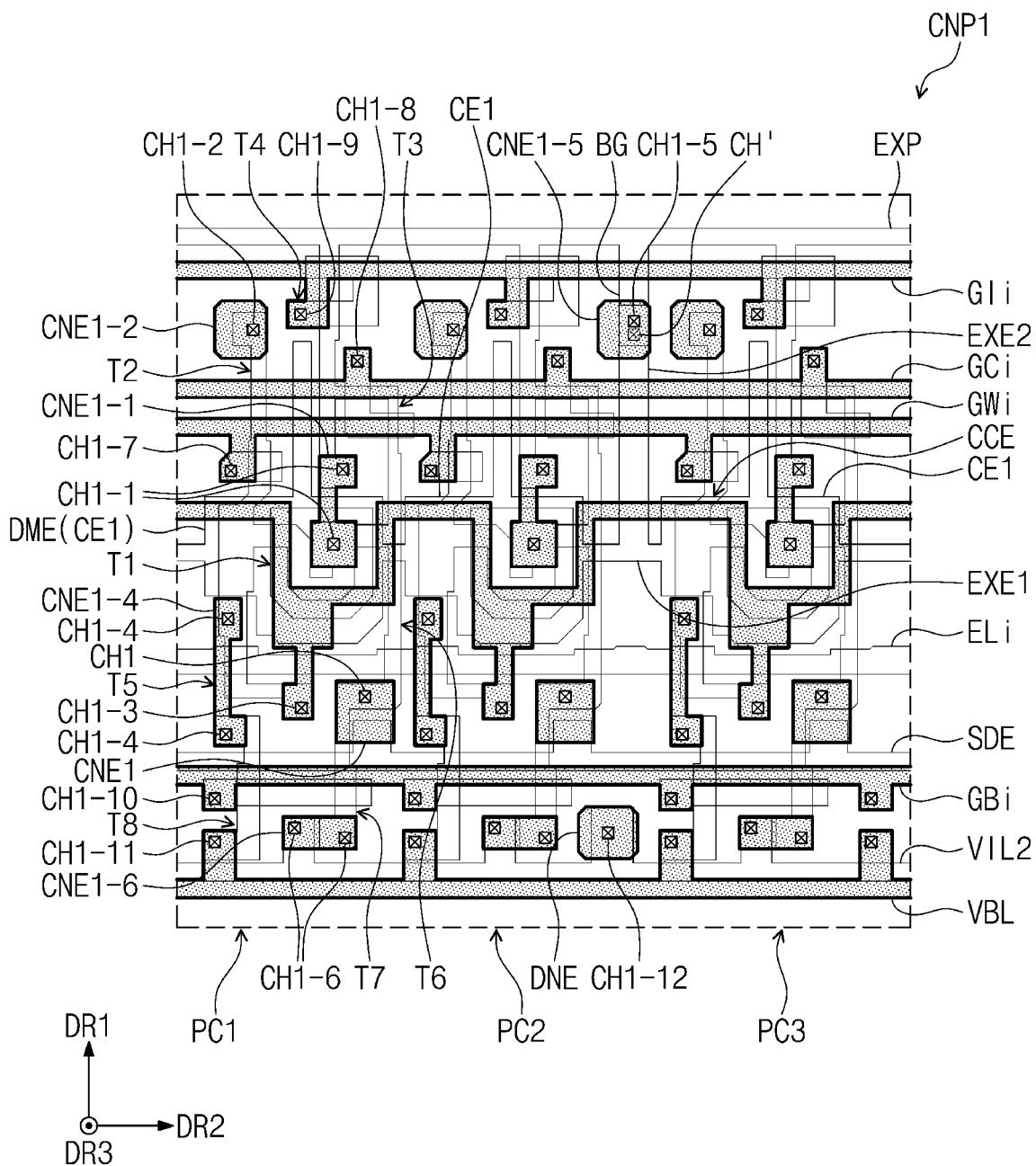
Figure 15D:
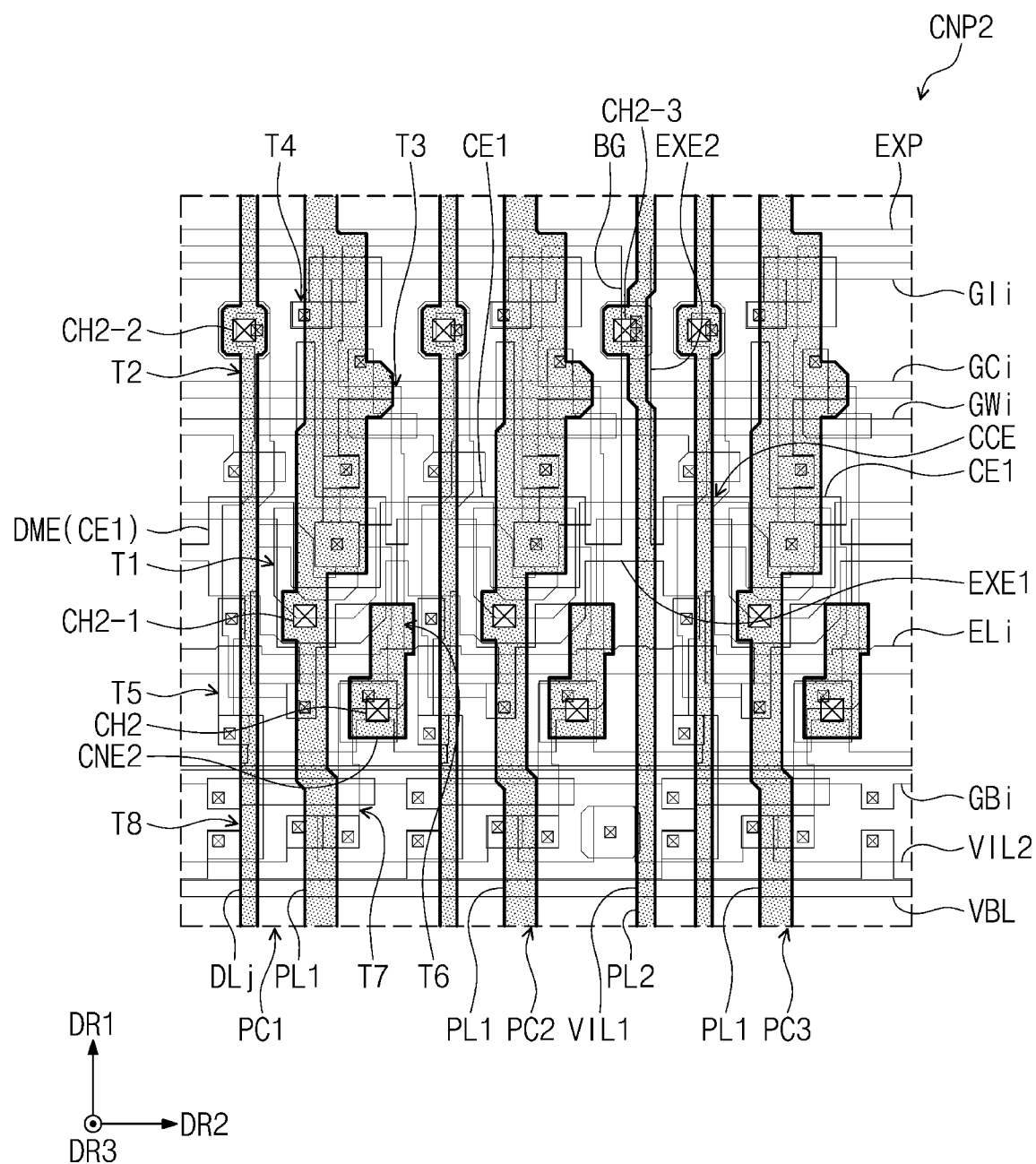

The extension pattern EXP may be connected to the first initialization line VIL1 illustrated in FIG. 15D. This configuration will be described below with reference to FIG. 15D.

A first electrode CE1 of each of the second and third pixel circuits PC2 and PC3 may be connected to the extension pattern EXP through a contact hole CH'. Specifically, the first electrode CE1 of each of the second and third pixel circuits PC2 and PC3 may be connected to the branch portion BG that branches from the extension pattern EXP.

Referring to FIG. 15C, a first connecting pattern CNP1 may have substantially the same configuration as the first connecting pattern CNP1 illustrated in FIG. 13D. A first connecting electrode CNE1-5 may be connected to a common capacitor electrode CCE through a first contact hole CH1-5.

Referring to FIG. 15D, the first initialization line VIL1 may be used instead of the second power line PL2. In an embodiment, for example, the first initialization line VIL1 may be disposed in the region where the second power line PL2 illustrated in FIG. 13E is disposed. The other components of a second connecting pattern CNP2 illustrated in FIG. 15D may be the same as the components of the second connecting pattern CNP2 illustrated in FIG. 13E.

The first initialization line VIL1 may be connected to a first connecting electrode CNE1-5 through a second contact hole CH2-3. The first initialization line VIL1 may be connected to the branch portion BG through the first connecting electrode CNE1-5 and a second extension electrode EXE2. Accordingly, the first initialization line VIL1 may be connected to the extension pattern EXP, and the first initialization voltage VINT may be applied to a fourth transistor T4.

The first initialization line VIL1 may be connected to the common capacitor electrode CCE through the first connecting electrode CNE1-5. Accordingly, the first initialization voltage VINT may be applied to the first electrode CE1 of the capacitor Cst through the first initialization line VIL1.

Figure 16:
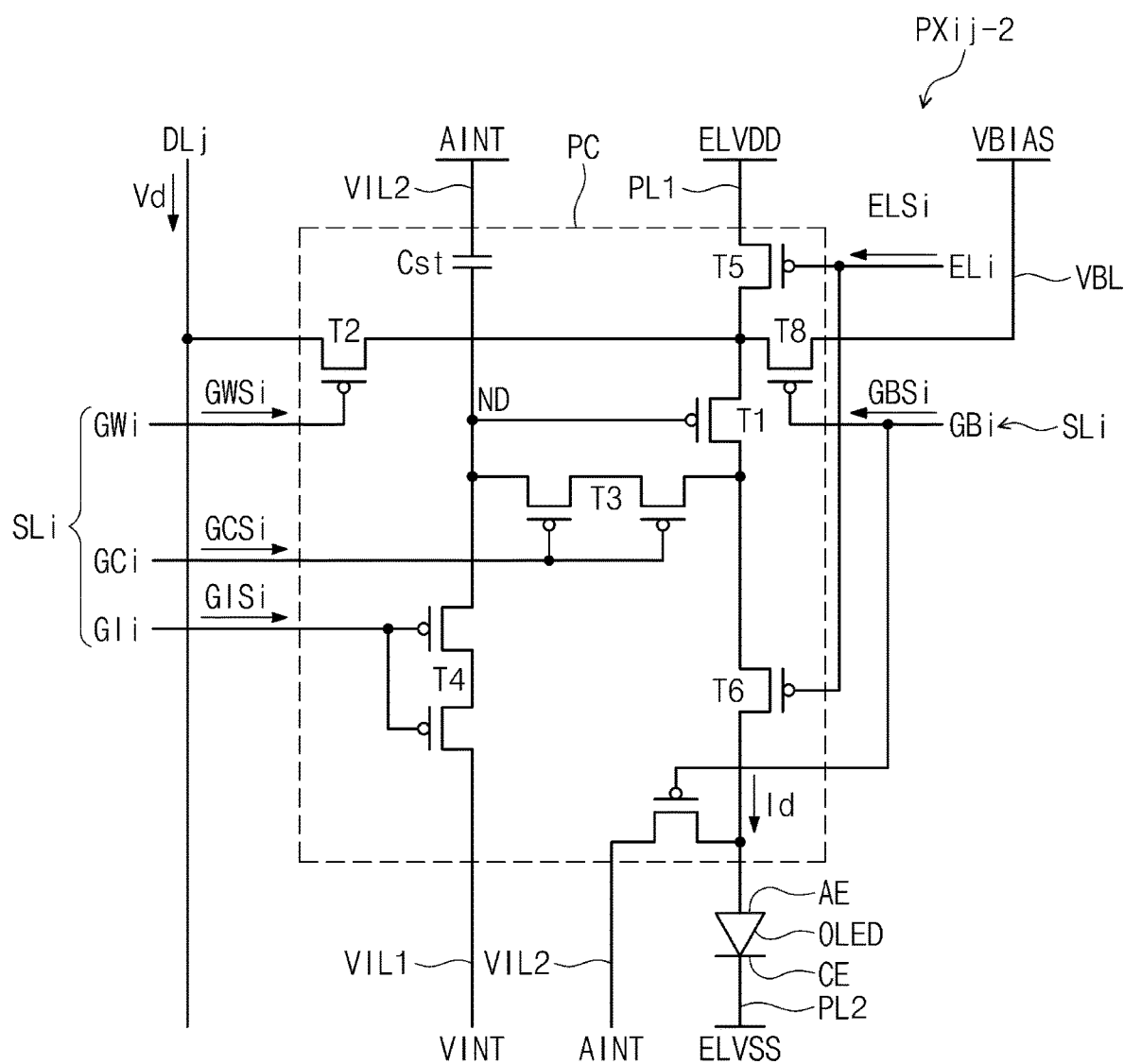
FIG. 16 is a view illustrating an equivalent circuit of a pixel according to still another embodiment of the present disclosure.

FIG. 16 is a view illustrating an equivalent circuit of a pixel according to still another embodiment of the present disclosure.

Hereinafter, the configuration of the pixel PXij-2 illustrated in FIG. 16 will be described. The following description will be focused on components different from the components illustrated in FIG. 7.

Referring to FIG. 16, a first electrode of a capacitor Cst may be connected to a second initialization line VIL2 and may receive a second initialization voltage AINT. The second initialization voltage AINT that is a constant voltage may be applied to the first electrode of the capacitor Cst. The second initialization line VIL2 may be defined as a constant voltage line. The other components of the pixel PXij-2 may be the same as the components of the pixel PXij illustrated in FIG. 7.

Figure 17:
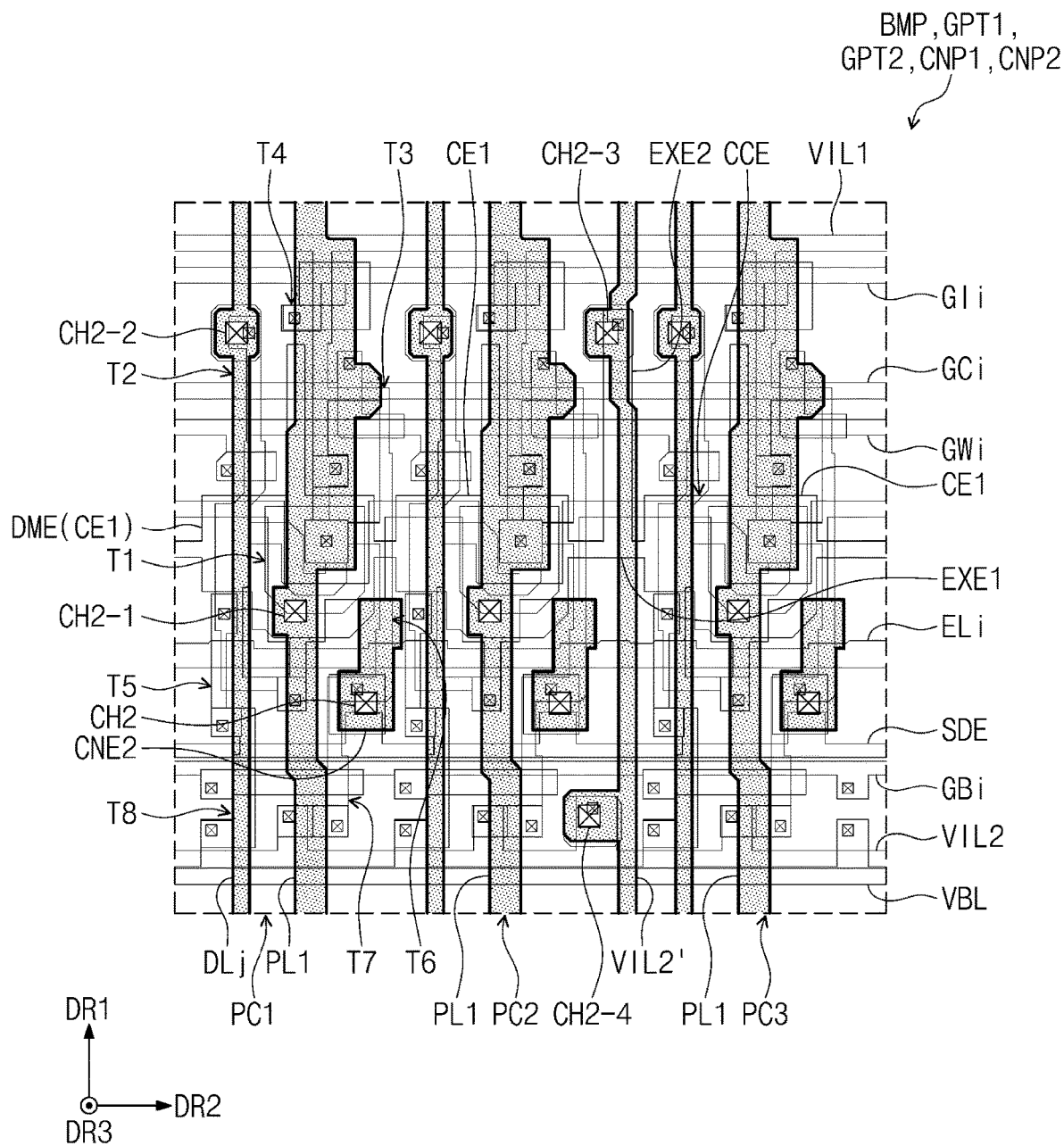
FIG. 17 is a layout drawing of a pixel circuit illustrated in FIG. 16.

FIG. 17 is a layout drawing of a pixel circuit illustrated in FIG. 16.

Hereinafter, components illustrated in FIG. 17 will be described. The following description will be focused on components different from the components illustrated in FIGS. 13A to 13E.

Referring to FIG. 17, a semiconductor pattern SMP, a first gate pattern GPT1, a second gate pattern GPT2, and a first connecting pattern CNP1 may have substantially the same configuration as the semiconductor pattern SMP, the first gate pattern GPT1, the second gate pattern GPT2, and the first connecting pattern CNP1 illustrated in FIGS. 13A to 13D.

In a second connecting pattern CNP2, a second initialization line VIL2' may be used instead of the second power line PL2. In an embodiment, for example, the second initialization line VIL2' may be disposed in the region where the second power line PL2 illustrated in FIG. 13E is disposed. The other components of the second connecting pattern CNP2 illustrated in FIG. 17 may be substantially the same as the components of the second connecting pattern CNP2 illustrated in FIG. 13E.

The second initialization line VIL2' may be connected to a first connecting electrode CNE1-5 through a second contact hole CH2-3. The second initialization line VIL2' may be connected to a common capacitor electrode CCE through the first connecting electrode CNE1-5.

The second initialization line VIL2' may be connected to a dummy connecting electrode DNE through a second contact hole CH2-4. As described above with reference to FIG. 13D, the dummy connecting electrode DNE may be connected to a second initialization line VIL2 through a first contact hole CH1-12.

The second initialization line VIL2 may be connected to the common capacitor electrode CCE through the dummy connecting electrode DNE, the second initialization line VIL2' and the first connecting electrode CNE1-5. Accordingly, the second initialization voltage AINT may be applied to the first electrode CE1 of the capacitor Cst through the second initialization line VIL2.

According to the embodiments of the present disclosure, the first electrode of the capacitor of the pixel circuit may not be connected to the first power line greatly affected by the data voltage, but may be connected to the second power line less affected by the data voltage. Depending on the variation of the data voltage, the level of the first voltage received through the first power line may be greatly varied, and the level of the second voltage received through the second power line may be less varied. The capacitor may receive the second voltage that is less varied, and thus the display device may normally display an image.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device comprising:
   a first pixel circuit, a second pixel circuit, and a third pixel circuit;
   a light emitting element connected to each of the first, second, and third pixel circuits; and
   an extension electrode,
   wherein each of the first, second, and third pixel circuits includes:
   a first transistor including a first electrode connected to a first power line, a second electrode connected to an anode of the light emitting element, and a control electrode connected to a node;
   a second transistor including a first electrode connected to a data line, a second electrode connected to the first electrode of the first transistor, and a control electrode connected to a write scan line; and
   a capacitor including a first electrode connected to a constant voltage line and a second electrode connected to the node, and
   wherein the constant voltage line is disposed between the second pixel circuit and the third pixel circuit and includes a second power line for receiving a second voltage having a lower level than a first voltage received by the first power line, and
   the extension electrode is connected to the first electrode of the capacitor of each of the second and third pixel circuits, extends between the second pixel circuit and the third pixel circuit, and is connected to the constant voltage line,
   wherein the second power line extends in a first direction, and the first, second, and third pixel circuits are arranged in a second direction crossing the first direction,
   wherein the extension electrode includes:
   a first extension electrode extending between the second pixel circuit and the third pixel circuit from the first electrode of the capacitor of the second pixel circuit and the first electrode of the capacitor of the third pixel circuit and extending in the second direction; and
   a second extension electrode extending between the second pixel circuit and the third pixel circuit in the first direction from the first extension electrode,
   wherein the second extension electrode is connected to the second power line and at least partially overlaps the second power line in a plan view.

2. The display device of claim 1, wherein the first power line is connected to the anode of the light emitting element, and the second power line is connected to a cathode of the light emitting element.

3. The display device of claim 1, wherein the first electrodes of the capacitors of the first, second, and third pixel circuits are arranged in the second direction and monolithic.

4. The display device of claim 3, wherein the monolithic first electrodes of the capacitors and the extension electrode are defined as a common capacitor electrode, and
   wherein a part of the common capacitor electrode extends in the first direction between the second pixel circuit and the third pixel circuit and is connected to the second power line.

5. The display device of claim 3, wherein the first power line is provided in plurality, the plurality of first power lines extend in the first direction and are arranged in the second direction, and the plurality of first power lines overlap the capacitors, respectively in a plan view.

6. The display device of claim 1, wherein the second power line has a smaller area than the first power line in a plan view.

7. The display device of claim 1, wherein a parasitic capacitor formed by the second power line has a smaller capacitance than a parasitic capacitor formed by the first power line.

8. The display device of claim 1, wherein the second power line is not disposed between the first pixel circuit and second pixel circuit in a plan view.

9. The display device of claim 1, wherein each of the first, second, and third pixel circuits further includes:
   a third transistor including a first electrode connected to the second electrode of the first transistor, a second electrode connected to the node, and a control electrode connected to a compensation scan line; and
   a fourth transistor including a first electrode connected to the node, a second electrode connected to a first initialization line, and a control electrode connected to an initialization scan line.

10. The display device of claim 9, wherein the constant voltage line includes the first initialization line, and
    wherein the first initialization line receives a first initialization voltage, and the first initialization voltage has a level different from a voltage level of a first voltage received by the first power line.

11. The display device of claim 10, wherein the first electrode of the capacitor is connected to an extension pattern extending from a drain region of a semiconductor pattern of the fourth transistor.

12. The display device of claim 11, further comprising:
    a branch portion branching from the extension pattern and disposed between the second pixel circuit and the third pixel circuit,
    wherein the first electrode of the capacitor is connected to the branch portion.

13. The display device of claim 10, wherein each of the first, second, and third pixel circuits further includes:
    a fifth transistor including a first electrode connected to the first power line, a second electrode connected to the first electrode of the first transistor, and a control electrode connected to an emission line;
    a sixth transistor including a first electrode connected to the second electrode of the first transistor, a second electrode connected to the anode, and a control electrode connected to the emission line;
    a seventh transistor including a first electrode connected to the anode, a second electrode connected to a second initialization line, and a control electrode connected to a bias scan line; and
    an eighth transistor including a first electrode connected to a bias line for receiving a bias voltage, a second electrode connected to the first electrode of the first transistor, and a control electrode connected to the bias scan line.

14. The display device of claim 13, wherein the constant voltage line includes the second initialization line for receiving a second initialization voltage, and
wherein the second initialization voltage has a level different from the voltage level of the first voltage received by the first power line.

15. A display device comprising: a first pixel circuit, a second pixel circuit, and a third pixel circuit; and a light emitting element connected to each of the first, second, and third pixel circuits, wherein each of the first, second, and third pixel circuits includes: a first transistor including a first electrode connected to a first power line, a second electrode connected to an anode of the light emitting element, and a control electrode connected to a node; a second transistor including a first electrode connected to a data line, a second electrode connected to the first electrode of the first transistor, and a control electrode connected to a write scan line; and a capacitor including a first electrode connected to a constant voltage line and a second electrode connected to the node, wherein the constant voltage line includes a second power line for receiving a second voltage having a lower level than a first voltage received by the first power line, wherein an extension electrode is connected to the first electrode of the capacitor of each of the second and third pixel circuits, extends between the second pixel circuit and the third pixel circuit, and is connected to the constant voltage line, and wherein the first electrodes of the capacitors of the first, second, and third pixel circuits are monolithic and connected to the constant voltage lines wherein the extension electrode includes: a first extension electrode extending between the second pixel circuit and the third pixel circuit from the first electrode of the capacitor of the second pixel circuit and the first electrode of the capacitor of the third pixel circuit and extending in a second direction; and a second extension electrode extending between the second pixel circuit and the third pixel circuit in a first direction from the first extension electrode, wherein the second extension electrode is connected to the second power line and at least partially overlaps the second power line in a plan view.

16. The display device of claim 15, wherein the constant voltage line is disposed between the second pixel circuit and the third pixel circuit, and wherein the monolithic first electrodes of the capacitors and the extension electrode are defined as a common capacitor electrode, and the extension electrode extends in the first direction between the second pixel circuit and the third pixel circuit and is connected to the constant voltage line.

17. An electronic device for provide an image, comprising:
a display device comprising:
a first pixel circuit, a second pixel circuit, and a third pixel circuit;
a light emitting element connected to each of the first, second, and third pixel circuits; and
an extension electrode,
wherein each of the first, second, and third pixel circuits includes:
a first transistor including a first electrode connected to a first power line, a second electrode connected to an anode of the light emitting element, and a control electrode connected to a node;
a second transistor including a first electrode connected to a data line, a second electrode connected to the first electrode of the first transistor, and a control electrode connected to a write scan line; and
a capacitor including a first electrode connected to a constant voltage line and a second electrode connected to the node, and
wherein the constant voltage line is disposed between the second pixel circuit and the third pixel circuit, and
the extension electrode is connected to the first electrode of the capacitor of each of the second and third pixel circuits, extends between the second pixel circuit and the third pixel circuit, and is connected to the constant voltage line,
wherein the extension electrode includes:
a first extension electrode extending between the second pixel circuit and the third pixel circuit from the first electrode of the capacitor of the second pixel circuit and the first electrode of the capacitor of the third pixel circuit and extending in a second direction; and
a second extension electrode extending between the second pixel circuit and the third pixel circuit in a first direction from the first extension electrode,
wherein the second extension electrode is connected to a second power line and at least partially overlaps the second power line in a plan view,
wherein the first direction is substantially normal to the second direction.

* * * * *